United States Patent
Ella et al.

(10) Patent No.: US 12,267,063 B2
(45) Date of Patent: Apr. 1, 2025

(54) HARMONIC REDUCTION WITH FILTERING

(71) Applicant: RF360 SINGAPORE PTE. LTD., Singapore (SG)

(72) Inventors: Juha Sakari Ella, Halikko (FI); Edgar Schmidhammer, Stein an der Traun (DE)

(73) Assignee: RF360 Singapore Pte. Ltd., Singapore (SG)

( * ) Notice: Subject to any disclaimer, the term of this patent is extended or adjusted under 35 U.S.C. 154(b) by 384 days.

(21) Appl. No.: 17/484,228

(22) Filed: Sep. 24, 2021

(65) Prior Publication Data
US 2023/0093885 A1    Mar. 30, 2023

(51) Int. Cl.
H03H 9/54    (2006.01)
H01P 5/19    (2006.01)
H03H 9/66    (2006.01)

(52) U.S. Cl.
CPC .............. H03H 9/54 (2013.01); H01P 5/19 (2013.01); H03H 9/66 (2013.01)

(58) Field of Classification Search
CPC .. H03H 9/54; H03H 9/66; H03H 7/09; H03H 9/0095; H03H 7/46; H03H 9/706;
(Continued)

(56) References Cited

U.S. PATENT DOCUMENTS 3,344,368 A    9/1967 Alfred
9,240,622 B2    1/2016 Schmidhammer et al.
(Continued)

FOREIGN PATENT DOCUMENTS

DE    10234686 A1    9/2003
WO    03071677 A1    8/2003
(Continued)

OTHER PUBLICATIONS

Lin S-C., "Microstrip Dual/Quad-Band Filters with Coupled Lines and Quasi-Lumped Impedance Inverters Based on Parallel-Path Transmission", IEEE Transactions on Microwave Theory and Techniques, USA, vol. 59, No. 8, Aug. 31, 2011, pp. 1937-1946, XP011349988, figures 1, 2.
(Continued)

Primary Examiner — John W Poos
(74) Attorney, Agent, or Firm — Loza & Loza LLP

(57) ABSTRACT

An apparatus is disclosed for harmonic reduction with filtering. In example aspects, the apparatus includes a filter circuit with first and second filter ports, first and second lattice filters, and first and second signal manipulator circuits. The first signal manipulator circuit includes a first port, a second port, and a third port coupled to the first filter port. The first signal manipulator circuit splits an input signal into multiple split signals, shifts a phase thereof to produce at least one phase-shifted split signal, and provides the phase-shifted split signal to the first and second ports. The first lattice filter is coupled to the first port, and the second lattice filter is coupled to the second port. The second signal manipulator circuit includes a first port coupled to the first lattice filter, a second port coupled to the second lattice filter, and a third port coupled to the second filter port.

42 Claims, 23 Drawing Sheets

(58) Field of Classification Search
CPC ............ H03H 9/58; H03H 9/582; H03H 9/60; H03H 9/542; H01P 5/19
See application file for complete search history.

(56) References Cited

U.S. PATENT DOCUMENTS

| | | | |
|---|---|---|---|
| 9,948,278 | B2 | 4/2018 | Okuda |
| 10,484,022 | B2* | 11/2019 | Nilsson ................ H04B 1/0475 |
| 11,750,174 | B2 | 9/2023 | Ando et al. |
| 11,881,834 | B2 | 1/2024 | Yandrapalli et al. |
| 2003/0042995 | A1 | 3/2003 | Ella |
| 2003/0128081 | A1 | 7/2003 | Ella et al. |
| 2003/0197578 | A1* | 10/2003 | Shibahara ................ H03H 7/01 333/167 |
| 2004/0140866 | A1 | 7/2004 | Taniguchi |
| 2005/0212619 | A1* | 9/2005 | Aigner ................ H03H 9/0095 333/189 |
| 2008/0101263 | A1 | 5/2008 | Barber et al. |
| 2009/0315640 | A1 | 12/2009 | Umeda et al. |
| 2013/0090080 | A1* | 4/2013 | Schmidt .................. H03H 9/54 455/307 |
| 2013/0169378 | A1* | 7/2013 | Kim ........................ H03H 7/46 333/132 |
| 2015/0236842 | A1* | 8/2015 | Goel .................... H04L 5/1461 370/278 |
| 2017/0070205 | A1 | 3/2017 | Hashemi et al. |
| 2017/0141757 | A1 | 5/2017 | Schmidhammer |
| 2018/0076793 | A1 | 3/2018 | Khlat et al. |
| 2018/0123555 | A1 | 5/2018 | Lee |
| 2018/0331671 | A1 | 11/2018 | Jian et al. |
| 2018/0358947 | A1 | 12/2018 | Mateu et al. |
| 2020/0287520 | A1 | 9/2020 | Kamgaing et al. |
| 2021/0384890 | A1 | 12/2021 | Schmidhammer |
| 2022/0247385 | A1 | 8/2022 | Esquius Morote |
| 2023/0318574 | A1 | 10/2023 | Damy et al. |
| 2023/0353117 | A1 | 11/2023 | Schmidhammer et al. |
| 2024/0007075 | A1 | 1/2024 | Tabrizian et al. |
| 2024/0014803 | A1 | 1/2024 | Khlat |
| 2024/0039576 | A1 | 2/2024 | Elaasar et al. |
| 2024/0105718 | A1 | 3/2024 | Chu et al. |

FOREIGN PATENT DOCUMENTS

| | | |
|---|---|---|
| WO | 2019185285 A1 | 10/2019 |
| WO | 2020114849 A1 | 6/2020 |

OTHER PUBLICATIONS

Yang Q., et al., "A Wideband Bulk Acoustic Wave Filter with Modified Lattice Configuration", 2015 IEEE MTT-S International Microwave Symposium, May 17, 2015, 4 pages, XP033181252, figure 4.

Kerherve, et al., "BAW Technologies: Development and Applications within Martina, Mimosa and Mobilis IST European Projects", Oct. 2006, pp. 341-350.

Arrawatia M., et al., "A Cmos Power Amplifier with 180° Hybrid On-Chip Coupler for 4G Applications", IEEE 58th International Midwest Symposium on Circuits and Systems (MWSCAS), 2015, 4 pages.

Constantinescu F., et al., "Behavioral Circuit Models of Power BAW Resonators and Filters", DOI: 10.1007/s10470-011-9758-7, Analog Integrated Circuits and Signal Processing, Oct. 2012, 9 Pages.

Hartmann C.S., et al., "Modeling of Saw Transversely Coupled Resonators Filters using Coupling-of-Modes Modeling Technique", IEEE Ultrasonics Symposium, 1992, pp. 39-43.

Co-pending U.S. Appl. No. 17/934,414, inventor Schmidhammer; Edgar, filed Sep. 22, 2022.

Co-pending U.S. Appl. No. 17/934,437, inventor Schmidhammer; Edgar, filed Sep. 22, 2022.

International Search Report and Written Opinion—PCT/EP2022/073885—ISA/EPO—Apr. 4, 2023.

Sauerland F., et al., "Ceramic IF Filters for Consumer Products", IEEE Spectrum, IEEE Inc, New York, US, vol. 5, No. 11, Nov. 30, 1968, pp. 112-126, XP008090908, ISSN: 0018-9235, p. 10, col. 1, Line 7-Line 45, Figure 20B, paragraph [0068], figure 6.

Partial International Search Report—PCT/EP2022/073885—ISA/EPO—Dec. 19, 2022, 16 pages.

* cited by examiner

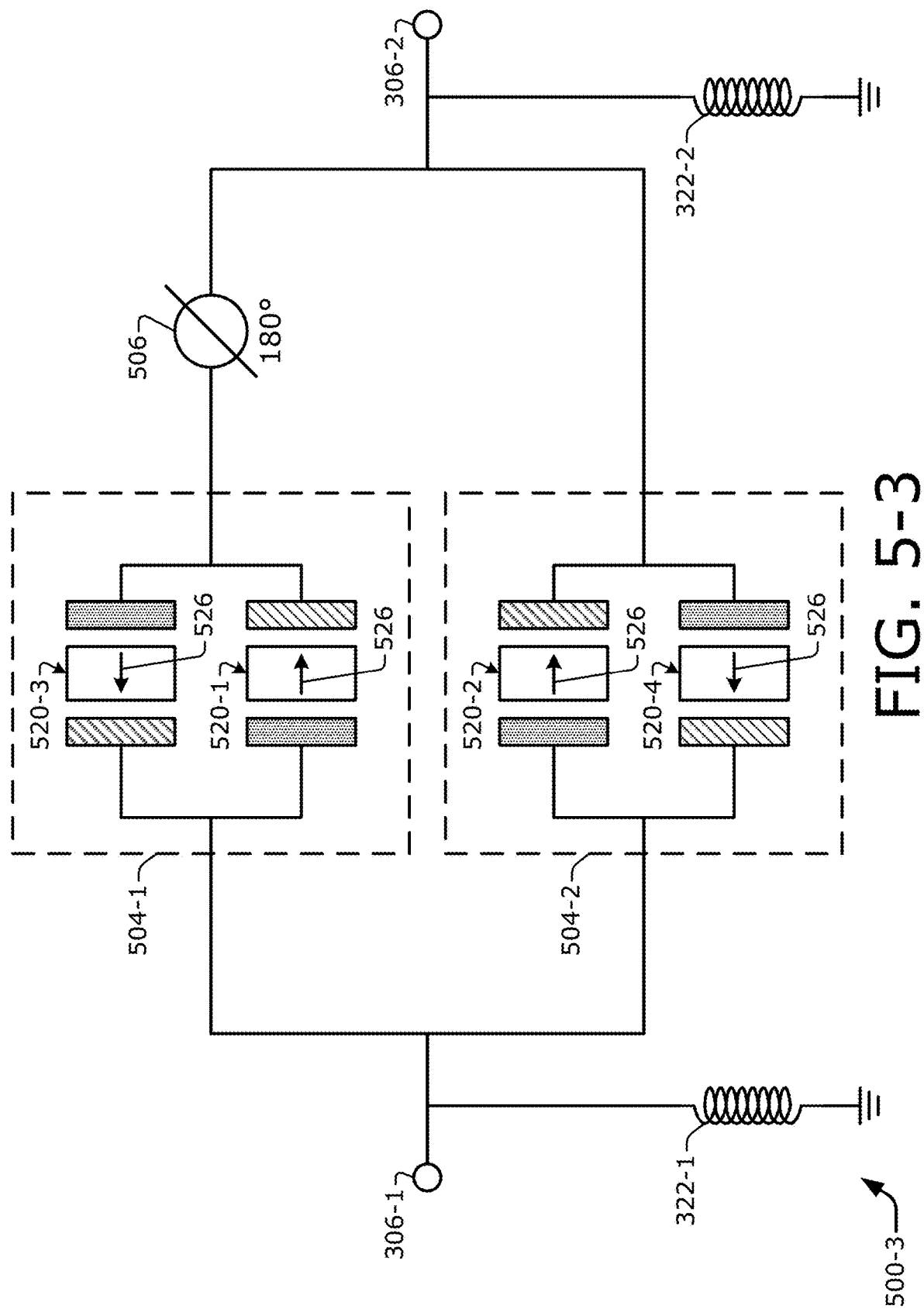

HARMONIC REDUCTION WITH FILTERING

TECHNICAL FIELD

This disclosure relates generally to signal communication or signal processing using an electronic device and, more specifically, to reducing signal harmonics with filtering.

BACKGROUND

Electronic devices include traditional computing devices such as desktop computers, notebook computers, smartphones, wearable devices like a smartwatch, internet servers, and so forth. Electronic devices also include other types of computing devices such as personal voice assistants (e.g., smart speakers), wireless access points or routers, thermostats and other automated controllers, robotics, automotive electronics, devices embedded in other machines like refrigerators and industrial tools, Internet of Things (IoT) devices, medical devices, and so forth. These various electronic devices provide services relating to productivity, communication, social interaction, security, health and safety, remote management, entertainment, transportation, and information dissemination. Thus, electronic devices play crucial roles in many aspects of modern society.

Many of the services provided by electronic devices in today's interconnected world depend at least partly on electronic communications. Electronic communications can include, for example, those exchanged between two or more electronic devices using wireless or wired signals that are transmitted over one or more networks, such as the Internet, a Wi-Fi® network, or a cellular network. Electronic communications can therefore include wireless or wired transmissions and receptions. To make such electronic communications, an electronic device can use a transceiver, such as a wireless transceiver that is designed for wireless communications.

Electronic communications can be realized by propagating signals between two wireless transceivers at two different electronic devices. For example, using a wireless transmitter, a smartphone can transmit a wireless signal to a base station over the air as part of an uplink communication to support mobile services. Using a wireless receiver, the smartphone can receive a wireless signal that is transmitted from the base station via the air medium as part of a downlink communication to enable mobile services. With a smartphone, mobile services can include making voice and video calls, participating in social media interactions, sending messages, watching movies, sharing videos, performing searches, acquiring map information or navigational instructions, finding friends, engaging in location-based services generally, transferring money, obtaining another service like a car ride, and so forth.

Many of these mobile services depend at least partly on the transmission and reception of wireless signals between two or more electronic devices. Consequently, researchers, electrical engineers, and designers of electronic devices strive to develop wireless transceivers that can use wireless signals effectively to provide these and other mobile services.

SUMMARY

To facilitate transmission and reception of wireless signals, an electronic device can use a wireless interface device that includes a wireless transceiver and/or a radio-frequency (RF) front-end. The wireless transceiver or RF front-end can include a filter that passes the desired frequencies of a signal but blocks the undesired ones. Some filters, like those that use acoustic resonators, are nonlinear and thus generate harmonics during a filtering process. These harmonics can harm wireless communications, such as if a harmonic of one signal falls within another frequency band being used by a wireless interface device for another signal. To at least reduce the negative effects of a harmonic, example described filter circuits include multiple lattice filters nested within "outer" signal manipulator circuits. The signal manipulator circuits can reduce a third-order harmonic in conjunction with the "inner" lattice filters. The lattice filters can lower a total quantity of acoustic resonators employed in the filter circuit and/or at least lower a second-order harmonic. For instance, two acoustic resonators can be arranged to have a virtually inverted crystal axis orientation relative to each other. During operation, this relative virtual axis inversion can enable the two acoustic resonators to at least reduce, if not substantially cancel, the second-order harmonic. In these manners, a signal can be filtered while reducing one or more harmonics.

In an example aspect, an apparatus is disclosed for harmonic reduction with filtering. The apparatus includes a filter circuit having a first filter port and a second filter port. The filter circuit includes a first signal manipulator circuit, a second signal manipulator circuit, a first lattice filter, and a second lattice filter. The first signal manipulator circuit includes a first port, a second port, and a third port coupled to the first filter port. The first signal manipulator circuit is configured to split an input signal into multiple split signals and shift a phase of one or more split signals of the multiple split signals to produce at least one phase-shifted split signal and at least one split signal. The first signal manipulator circuit is also configured to provide the at least one phase-shifted split signal and the at least one split signal to the first port and the second port. The first lattice filter is coupled to the first port of the first signal manipulator circuit, and the second lattice filter is coupled to the second port of the first signal manipulator circuit. The second signal manipulator circuit includes a first port coupled to the first lattice filter, a second port coupled to the second lattice filter, and a third port coupled to the second filter port. The second signal manipulator circuit is configured to accept multiple filtered signals from the first lattice filter and the second lattice filter and shift a phase of one or more filtered signals of the multiple filtered signals to produce at least one phase-shifted filtered signal and at least one filtered signal. The second signal manipulator circuit is also configured to combine the at least one phase-shifted filtered signal and the at least one filtered signal into an output signal at the third port of the second signal manipulator circuit.

In an example aspect, an apparatus is disclosed for filtering a signal. The apparatus includes means for manipulating an input signal to produce multiple manipulated signals including at least one phase-shifted manipulated signal. The apparatus also includes first means for filtering the at least one phase-shifted manipulated signal of the multiple manipulated signals to produce a first filtered signal. The apparatus additionally includes second means for filtering at least one manipulated signal of the multiple manipulated signals to produce a second filtered signal. The apparatus further includes means for manipulating the first filtered signal and the second filtered signal to produce an output signal having a reduced third-order harmonic relative to third-order harmonics generated by the first means and the second means.

In an example aspect, a method for filtering a signal is disclosed. The method includes splitting an input signal into multiple split signals and shifting a phase of one or more split signals of the multiple split signals to produce at least one phase-shifted split signal and at least one split signal. The method also includes filtering, using a first lattice filter, the at least one phase-shifted split signal to produce a first filtered signal. The method additionally includes filtering, using a second lattice filter, the at least one split signal to produce a second filtered signal. The method also includes shifting at least one of a phase of the first filtered signal or a phase of the second filtered signal to produce at least one phase-shifted filtered signal and at least one filtered signal. The method further includes combining the at least one phase-shifted filtered signal and the at least one filtered signal to produce an output signal.

In an example aspect, an apparatus for harmonic reduction with filtering is disclosed. The apparatus includes a filter circuit that includes a first hybrid coupler, a second hybrid coupler, a first lattice filter, and a second lattice filter. The first hybrid coupler includes a first port, a second port, a third port, and a fourth port. The third port is coupled to a first filter port of the filter circuit, and the fourth port is coupled to a first load. The second hybrid coupler includes a first port, a second port, a third port, and a fourth port. The third port of the second hybrid coupler is coupled to a second load, and the fourth port of the second hybrid coupler is coupled to a second filter port of the filter circuit. The first lattice filter is coupled between the first port of the first hybrid coupler and the first port of the second hybrid coupler. The second lattice filter is coupled between the second port of the first hybrid coupler and the second port of the second hybrid coupler.

In an example aspect, an apparatus for harmonic reduction with filtering is disclosed. The apparatus includes a filter circuit that includes a first filter port, a second filter port, a first half lattice filter, and a second half lattice filter. The first half lattice filter is coupled between the first filter port and the second filter port. The first half lattice filter includes a phase shifter, a first acoustic resonator, a second acoustic resonator, a third acoustic resonator, and a fourth acoustic resonator. The first acoustic resonator, the third acoustic resonator, and the phase shifter are coupled together in series between a first port of the first half lattice filter and a second port of the first half lattice filter. The second acoustic resonator and the fourth acoustic resonator are coupled together in series between the first port of the first half lattice filter and the second port of the first half lattice filter. The second half lattice filter is coupled between the first filter port and the second filter port. The second half lattice filter includes a phase shifter, a first acoustic resonator, a second acoustic resonator, a third acoustic resonator, and a fourth acoustic resonator. The first acoustic resonator, the third acoustic resonator, and the phase shifter of the second half lattice filter are coupled together in series between a first port of the second half lattice filter and a second port of the second half lattice filter. The second acoustic resonator and the fourth acoustic resonator are coupled together in series between the first port of the second half lattice filter and the second port of the second half lattice filter.

BRIEF DESCRIPTION OF DRAWINGS

FIG. 2-1 is a schematic diagram illustrating an example transceiver and radio-frequency front-end (RFFE) that each include at least one filter circuit.

FIG. 2-2 is a schematic diagram illustrating an example RF front-end that can include one or more filter circuits coupled to at least one amplifier via a switch.

FIG. 3-1 is a circuit diagram illustrating an example of a full lattice filter.

FIGS. 3-2 to 3-6 are circuit diagrams illustrating examples of a half lattice filter.

FIG. 4-1 is a schematic diagram including example signal manipulation circuits that each have at least one hybrid coupler.

FIG. 4-2 is a schematic diagram including example signal manipulation circuits that each have at least one power divider/combiner and at least one phase shifter.

FIG. 5 is a schematic diagram illustrating an example half lattice filter.

FIG. 5-1 is a circuit diagram illustrating an example half lattice filter with multiple acoustic resonators.

FIG. 5-2 is a circuit diagram illustrating an example half lattice filter with acoustic resonators that are connected in "anti-series."

FIG. 5-3 is a circuit diagram illustrating an example half lattice filter with acoustic resonators that are connected in "anti-parallel."

FIG. 6-1 depicts examples of a cross-section view and a circuit view of a bulk acoustic wave (BAW) resonator.

FIG. 6-2 depicts examples of a cross-section view and a circuit view of two anti-series-connected BAW resonators.

FIG. 6-3 depicts examples of a cross-section view and a circuit view of two anti-parallel-connected BAW resonators.

DETAILED DESCRIPTION

Figure 1:
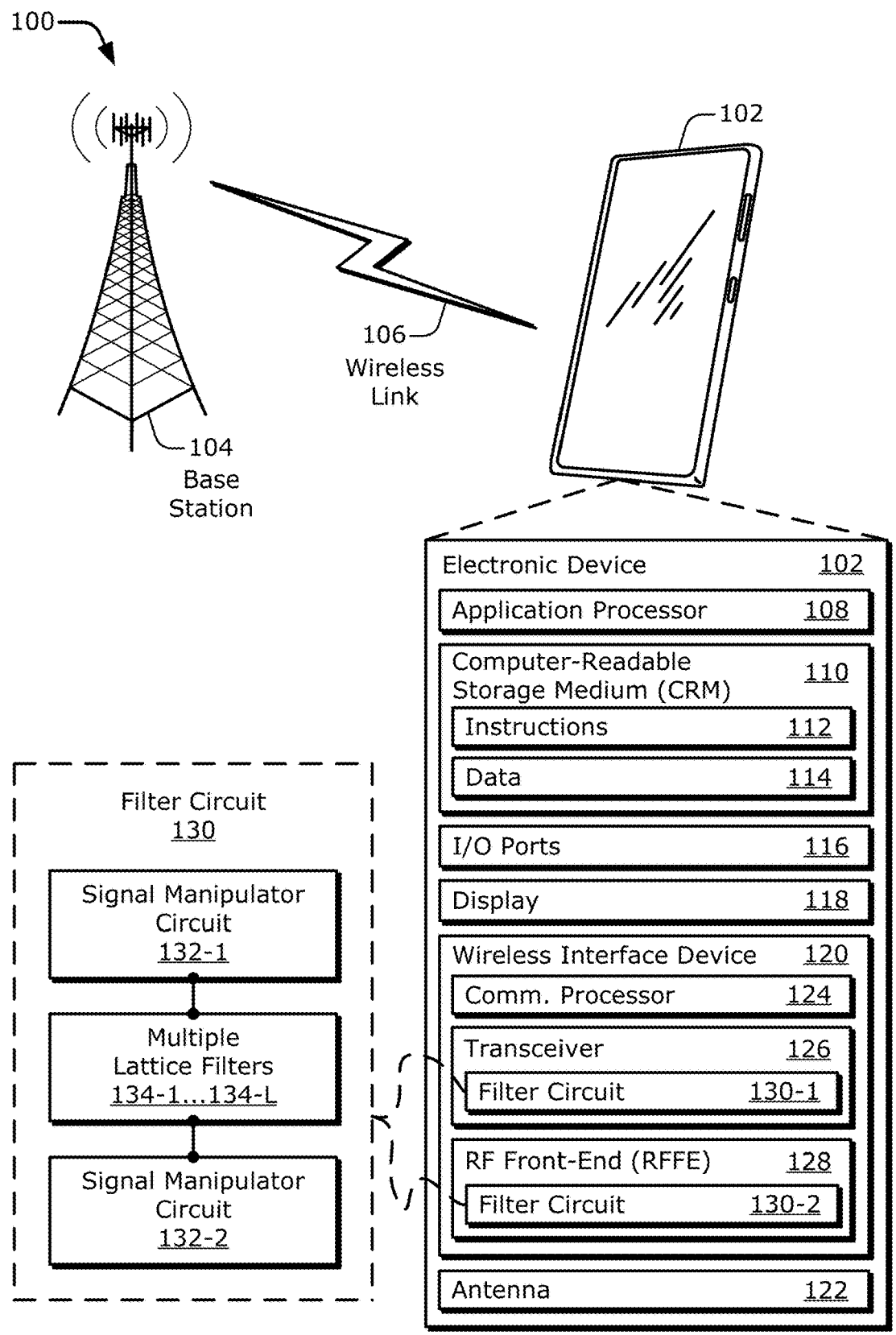
FIG. 1 illustrates an environment with an example electronic device that includes a wireless interface device, which has at least one filter circuit.

Electronic devices communicate with wireless signals using electromagnetic (EM) frequencies that exist on a portion of the EM spectrum. These wireless signals may travel between two electronic devices at some frequency, such as a kilohertz (kHz) frequency, a megahertz (MHz) frequency, or a gigahertz (GHz) frequency. The EM spectrum is, however, a finite resource that limits how many signals can be simultaneously communicated in any given spatial area. There are already billions of electronic devices that use this limited resource. To enable more simultaneous communications using EM signaling, the finite EM spectrum can be shared among electronic devices. The EM spectrum can be shared using, for instance, frequency division duplexing (FDD) and/or time division duplexing (TDD) techniques.

Techniques for FDD can entail separating the EM spectrum into different frequency bands and communicating within an assigned frequency band. Signals in different frequency bands can be communicated at the same time in a same area without significantly interfering with each other. To transmit a signal within a target frequency band, a transmitter can apply a filter to the signal. The filter passes the frequencies of the target frequency band and excludes, or blocks, other frequencies.

Although filters support FDD techniques, filters can create problems with wireless communications. For example, some filters are nonlinear, such as acoustic filters that use a piezoelectric material to form an acoustic resonator. During operation, a nonlinear filter can produce one or more harmonics while generally blocking undesired frequencies and passing the desired frequencies of a target frequency band. The target frequency band can include a fundamental frequency of a signal. A harmonic frequency or harmonic signal, or a "harmonic," can have a frequency that is a multiple of the fundamental frequency. Examples of harmonics include a second-order harmonic (e.g., double the fundamental frequency), a third-order harmonic (e.g., triple the fundamental frequency), and so forth. Thus, a filter can generate a harmonic that is outside the target frequency band. These issues can extend to systems operating with TDD signals. For example, the second harmonic of a 2.4 gigahertz (GHz) Wi-Fi® signal falls on the cellular band n79. Both can be operated as TDD systems. Nonetheless, because such systems may not be synchronized, a Wi-Fi® component can be transmitting while a component for the cellular band n79 is in receive mode. In such a scenario, the second harmonic of the Wi-Fi® transmit signal disturbs the n79 receive signal and can create a sufficient level of interference so as to prevent reception of the n79 cellular signal.

Generally, a harmonic can be outside the target frequency band and within another frequency band that is intended for a different wireless signal by a same electronic device or another electronic device, such as with the Wi-Fi® and n79 cellular band example presented above. A harmonic that is generated by a given electronic device may, therefore, interfere with FDD and/or TDD communication techniques. If the harmonic has sufficient power, the harmonic may further interfere with wireless signals being communicated by a different electronic device that is proximate to the device that is generating the harmonic. Even if the harmonic does not contain sufficient power to interfere with other electronic devices, the harmonic can jeopardize communications by the same electronic device, as is explained next.

Some electronic devices may concurrently communicate in two or more frequency bands, such as a relatively lower frequency band and a relatively higher frequency band. If a harmonic generated in the lower frequency band falls within the higher frequency band, the harmonic can cause self-interference with an electronic device. For example, a filter for a 5 GHz frequency band may generate a 10 GHz second-order harmonic. In some cases, the electronic device may be transmitting on a 5 GHz frequency band while concurrently trying to receive on a 10 GHz frequency band. The 10 GHz harmonic generated by a filter in a transmit path can, consequently, interfere with reception of a signal in a receive path at the 10 GHz frequency band. For example, a transmission around 5 GHz for a sub-6 GHz communication may generate a harmonic at about 10 GHz, which can interfere with an intermediate frequency (IF) of 10 GHz for a millimeter-wave (mmW) reception operation.

In addition to harmonics, nonlinear filters may generate intermodulation distortion (IMD) products that can also be detrimental to operation of a wireless interface device. The harmonic or IMD product generated by one or more transmit paths may fall into a frequency band that is being used by a receive path, e.g., in a carrier aggregation (CA) scenario. The harmonic or IMD product can desensitize the receiver, making reception and demodulation less reliable. The harmonic or IMD product can impact a receive path through unwanted coupling in an antenna multiplexer, via leakage in a printed circuit board (PCB) or a radio-frequency front-end (RFFE) module, or due to EM coupling between two antennas.

In some approaches, filters are redesigned or specially operated to attempt to increase the linearity of the signal processing. For example, linearity can be increased by changing the physical topology of some filters. Also, the effects of nonlinearity can be reduced by lowering the currents and/or voltages that are applied to a filter, or the individual constituent components thereof. These approaches, however, provide inadequate increases in linearity for some applications.

This document describes various implementations to decrease the production or effect of nonlinear spurious signaling, such as that caused by harmonics and IMD products. In some example implementations, a filter circuit includes nested portions. An "inner" filtering portion can be nested within or between two "outer" signal manipulating portions. Each outer signal manipulator circuit splits or combines signal components and phase shifts at least one of the signal components. For instance, one signal manipulator circuit can split an input signal into two split signals, which can have substantially equal amplitudes, and phase shifts at least one of the split signals using one or more operations. After filtering by the inner filtering portion, the other signal manipulator circuit phase shifts and combines filtered signals to produce an output signal. If the phase shifting involves creating a ninety-degree (90°) phase difference between the signal components, the outer signal manipulation portions can reduce a third-order harmonic that is generated by the inner filtering portion. If the phase shifting induces a one-hundred-and-eighty-degree (180°) phase difference between the signal components, the outer signal manipulation portions can reduce a second-order harmonic that is generated by the inner filtering portion. Each of the signal manipulator circuits can be realized using a hybrid coupler or using a power divider/combiner in conjunction with at least one phase shifter, just to name a couple of examples.

In other example implementations, a quantity of acoustic resonators that are deployed in the inner filtering portion is reduced to save space and reduce a cost of the filter. Although acoustic resonators may be nonlinear, such resonators can be smaller than some other types of filters, like lumped-element filters or ceramic-based filters. Examples of acoustic resonator types include a bulk acoustic wave (BAW) resonator, a surface acoustic wave (SAW) resonator, a film bulk acoustic resonator (FBAR), a thin-film bulk acoustic resonator (TFBAR), and so forth. Even though smaller than some other filter types, each acoustic resonator nonetheless occupies some amount of space and increases a cost of a filter. To reduce space utilization and decrease costs, some implementations employ a lattice filter as at least part of the inner filtering portion. For example, a dual half lattice filter arrangement can be deployed between two outer signal manipulating portions. Each half lattice filter can include fewer acoustic resonators than some other acoustic-resonator-based filter types.

In still other example implementations, an acoustic-resonator-based filter circuit, such as one that includes a half lattice filter with acoustic resonators, can employ acoustic resonators that virtually invert a crystal axis direction between two of the acoustic resonators. In other words, two acoustic resonators with similar or identical characteristics can be electrically connected to each other such that an electric field within the two acoustic resonators (e.g., across at least one piezolayer) are opposite in phase with respect to the crystal axis of each resonator. For example, "anti-parallel" or "anti-series" connected resonators can be deployed in a lattice (e.g., a half lattice) type of filter to at least reduce a second-order harmonic that is generated by, and that would otherwise be propagated away from, the lattice filter along with the filtered signal. By arranging a pair of acoustic resonators to have virtually complementary crystal axis directions for the piezoelectric material, each acoustic resonator can contract or expand at an opposite time as compared to the other resonator of the pair of acoustic resonators. This can at least substantially reduce the second-order harmonic of the, e.g., half lattice filter to the extent that the pair of acoustic resonators can be fabricated to be substantially identical or at least similar in physical structure.

Further, two or more of these various implementations may be combined in any manner. In an example filter circuit implementation, two outer signal manipulator circuits can be realized using 90° hybrid couplers to reduce third-order harmonics, and an inner filtering portion can be realized using multiple lattice filters to reduce a bill of materials for the acoustic resonator components of the filter circuit. Further, the lattice filters can employ acoustic resonators with virtually inverted crystal axis orientations to reduce, if not substantially cancel, second-order harmonics. Such implementations can therefore reduce the harmful effects of second-order and third-order harmonics. Other combinations can alternatively be implemented. In these manners, the impacts of harmonics or IMD products can be reduced in conjunction with filtering. Although this document describes filter circuits primarily in terms of being used in transmit chains, the described filter circuits may be used in other situations or parts of an electronic device, including in a receive chain of a wireless interface device.

FIG. 1 illustrates an example environment 100 with an electronic device 102 having a wireless interface device 120, which includes at least one filter circuit 130. This document describes example implementations of the filter circuit 130, which may be part of a transceiver, a radio-frequency front-end (RFFE), and so forth. In the environment 100, the example electronic device 102 communicates with a base station 104 through a wireless link 106. In FIG. 1, the electronic device 102 is depicted as a smartphone. The electronic device 102, however, may be implemented as any suitable computing or other electronic device. Examples of an apparatus that can be realized as an electronic device 102 include a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or smartwatch, wireless power device (transmitter or receiver), medical device, and so forth.

The base station 104 communicates with the electronic device 102 via the wireless link 106, which may be implemented as any suitable type of wireless link that carries a communication signal. Although depicted as a base station tower of a cellular radio network, the base station 104 may represent or be implemented as another device, such as a satellite, terrestrial broadcast tower, access point, peer-to-peer device, mesh network node, fiber optic line interface, another electronic device as described above generally, and so forth. Hence, the wireless link 106 can extend between the electronic device 102 and the base station 104 in some manner.

The wireless link 106 can include a downlink of data or control information communicated from the base station 104 to the electronic device 102. The wireless link 106 can also include an uplink of other data or control information communicated from the electronic device 102 to the base station 104. The wireless link 106 may be implemented using any suitable wireless communication protocol or standard. Examples of such protocols and standards include a 3rd Generation Partnership Project (3GPP) Long-Term Evolution (LTE) standard, such as a 4th Generation (4G) or a 5th Generation (5G) cellular standard; an IEEE 802.11 standard, such as 802.11g, ac, ax, ad, aj, or ay (e.g., Wi-Fi® 6 or WiGig®); an IEEE 802.16 standard (e.g., WiMAX®); a Bluetooth® standard; an ultra-wideband (UWB) standard (e.g., IEEE 802.15.4); and so forth. In some implementations, the wireless link 106 may provide power wirelessly, and the electronic device 102 or the base station 104 may comprise a power source.

As shown for some implementations, the electronic device 102 can include at least one application processor 108 and at least one computer-readable storage medium 110 (CRM 110). The application processor 108 may include any type of processor, such as a central processing unit (CPU) or a multi-core processor, that is configured to execute processor-executable instructions (e.g., code) stored by the CRM 110. The CRM 110 may include any suitable type of data storage media, such as volatile memory (e.g., random-access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus the CRM 110 does not include transitory propagating signals or carrier waves.

The electronic device 102 may also include one or more input/output ports 116 (I/O ports 116) and at least one display 118. The I/O ports 116 enable data exchanges or interaction with other devices, networks, or users. The I/O ports 116 may include serial ports (e.g., universal serial bus (USB®) ports), parallel ports, audio ports, infrared (IR) ports, cameras or other sensor ports, and so forth. The display 118 can be realized as a display screen or a projection that presents graphical images provided by other components of the electronic device 102, such as a user interface (UI) associated with an operating system, program, or application. Alternatively or additionally, the display 118 may be implemented as a display port or virtual interface through which graphical content of the electronic device 102 is communicated or presented.

The electronic device 102 further includes at least one wireless interface device 120 and at least one antenna 122. The example wireless interface device 120 provides connectivity to respective networks and peer devices via a wireless link, which may be configured similar to or differently from the wireless link 106. The wireless interface device 120 may facilitate communication over any suitable type of wireless network, such as a wireless LAN (WLAN), wireless personal-area-network (PAN) (WPAN), peer-to-peer (P2P) network, mesh network, cellular network, wireless wide-area-network (WAN) (WWAN), and/or a navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with the base station 104 via the wireless interface device 120. The electronic device 102 may, however, communicate directly with other peer devices, an alternative wireless network, and the like. Also, as described above, an electronic device 102 may alternatively be implemented as a base station 104 or another apparatus as set forth herein.

As shown, the wireless interface device 120 can include at least one communication processor 124, at least one transceiver 126, and at least one radio-frequency (RF) front-end 128 (RFFE 128). These components process data information, control information, and signals associated with communicating information for the electronic device 102 via the antenna 122. The communication processor 124 may be implemented as at least part of a system-on-chip (SoC), as a modem processor, or as a baseband radio processor (BBP) that enables a digital communication interface for data, voice, messaging, or other applications of the electronic device 102. The communication processor 124 can include a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and other components of the wireless interface device 120 to implement various communication protocols or communication techniques.

In some cases, the application processor 108 and the communication processor 124 can be combined into one module or integrated circuit (IC), such as an SoC. Regardless, the application processor 108, the communication processor 124, or a processor generally can be operatively coupled to one or more other components, such as the CRM 110 or the display 118, to enable control of, or other interaction with, the various components of the electronic device 102. For example, at least one processor 108 or 124 can present one or more graphical images on a display screen implementation of the display 118 based on one or more wireless signals received via the at least one antenna 122 using components of the wireless interface device 120. Further, the application processor 108 or the communication processor 124, including a combination thereof, can be realized using digital circuitry that implements logic or functionality that is described herein. Additionally, the communication processor 124 may also include or be associated with a memory (not separately depicted) to store data and processor-executable instructions (e.g., code), such as a CRM 110.

As shown, the wireless interface device 120 can include at least one filter circuit 130, which is described below. More specifically, the transceiver 126 can include at least one filter circuit 130-1, or the RF front-end 128 can include at least one filter circuit 130-2 (including both in accordance with an optional but permitted inclusive-or interpretation of the word "or"). The transceiver 126 can also include circuitry and logic for filtering, switching, amplification, channelization, frequency translation, and so forth. Frequency translation functionality may include an up-conversion or a down-conversion of frequency that is performed through a single conversion operation (e.g., with a direct-conversion architecture) or through multiple conversion operations (e.g., with a superheterodyne architecture). Generally, the transceiver 126 can include filters, switches, amplifiers, mixers, and so forth for routing and conditioning signals that are transmitted or received via the antenna 122.

In addition to the filter circuit 130-1, the transceiver 126 can include an analog-to-digital converter (ADC) or a digital-to-analog converter (DAC). In operation, an ADC can convert analog signals to digital signals, and a DAC can convert digital signals to analog signals. Generally, an ADC or a DAC can be implemented as part of the communication processor 124, as part of the transceiver 126, or separately from both (e.g., as another part of an SoC or as part of the application processor 108).

Figures 1, 2:
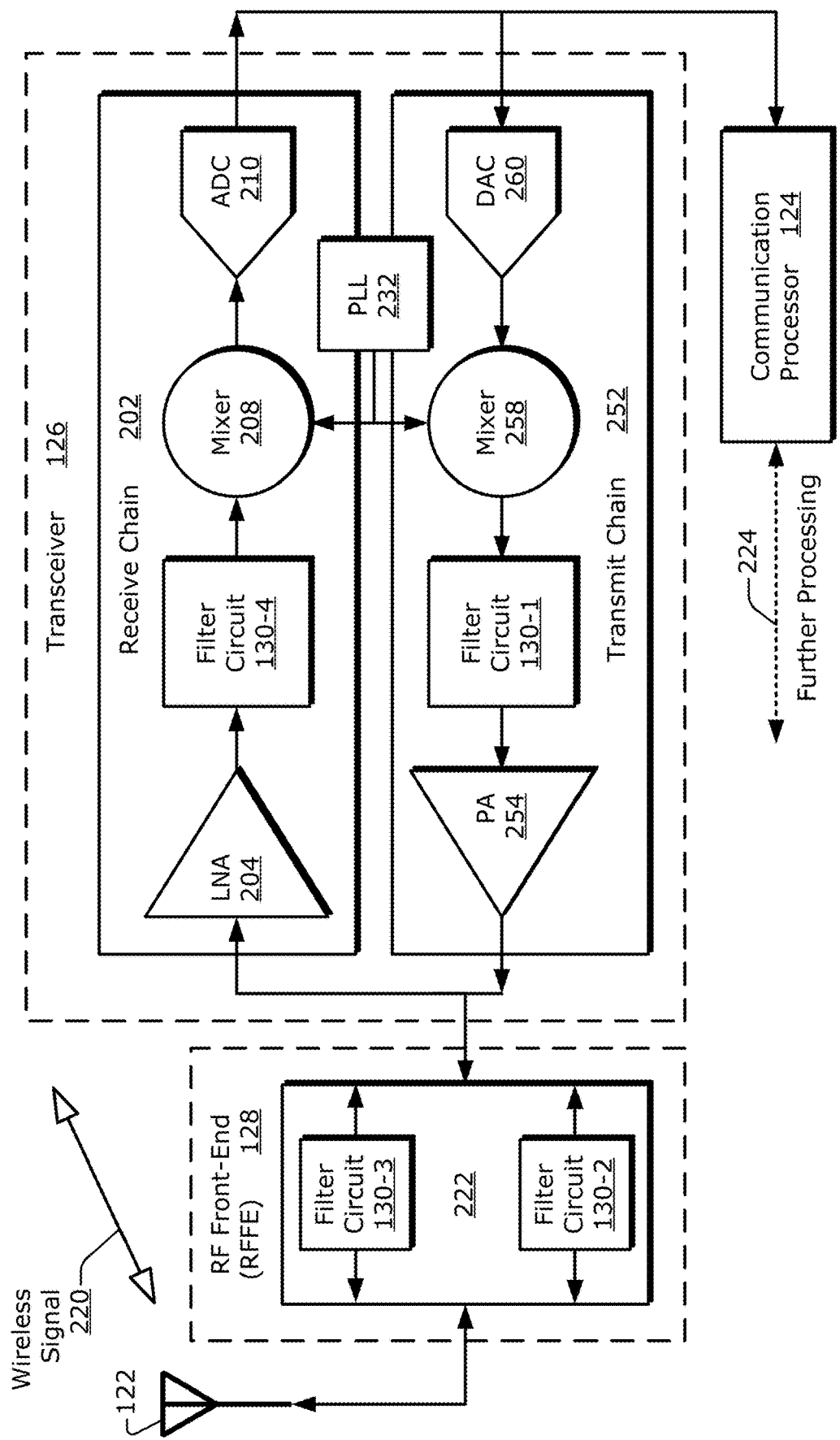
Figure 2:
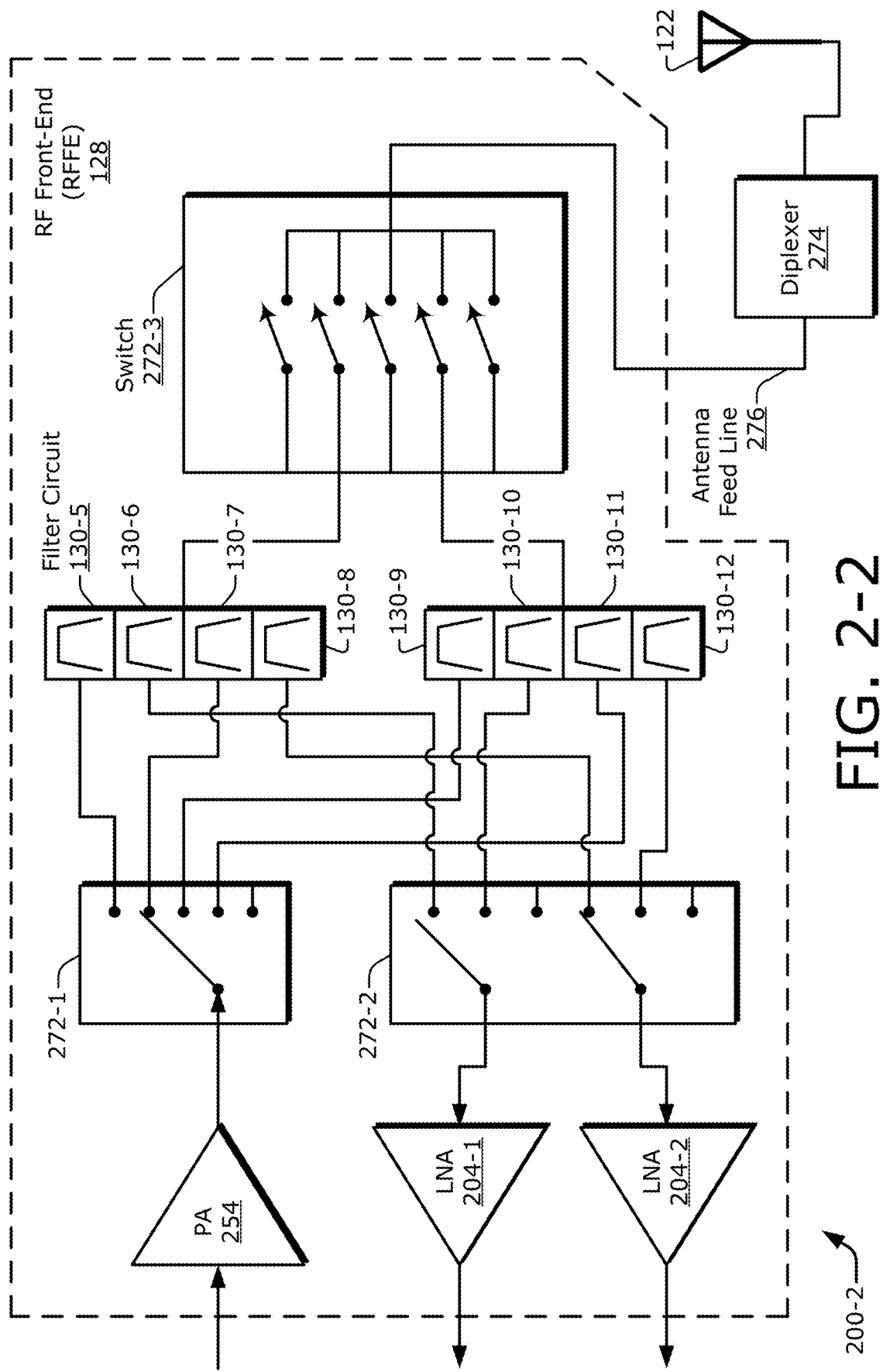

The components or circuitry of the transceiver 126 can be implemented in any suitable fashion, such as with combined transceiver logic or separately as respective transmitter and receiver entities. In some cases, the transceiver 126 is implemented with multiple or different sections to implement respective transmitting and receiving operations (e.g., with separate transmit and receive chains as depicted in FIG. 2). Although not shown in FIG. 1, the transceiver 126 may also include logic to perform in-phase/quadrature (I/Q) operations, such as synthesis, phase correction, modulation, demodulation, and the like.

The RF front-end 128 can include one or more filters—such as the filter circuit 130-2, multiple switches, or one or more amplifiers for conditioning signals received via the antenna 122 or for conditioning signals to be transmitted via the antenna 122. The RF front-end 128 may also include a phase shifter (PS), peak detector, power meter, gain control block, antenna tuning circuit, N-plexer, balun, and the like. Configurable components of the RF front-end 128, such as some phase shifters or an automatic gain controller (AGC), may be controlled by the communication processor 124 to implement communications in various modes, with different frequency bands, or using beamforming. In some implementations, the antenna 122 is implemented as at least one antenna array that includes multiple antenna elements. Thus, as used herein, an "antenna" can refer to at least one discrete or independent antenna, to at least one antenna array that includes multiple antenna elements, or to a portion of an antenna array (e.g., an antenna element), depending on context or implementation.

In FIG. 1, an example filter circuit 130 is depicted as being part of a transceiver 126 as a filter circuit 130-1, as being part of an RF front-end 128 as a filter circuit 130-2, and so forth. Described implementations of a filter circuit 130 can, however, additionally or alternatively be employed in other portions of the wireless interface device 120 or in other portions of the electronic device 102 generally. As set forth above, a filter circuit 130 can be included in an electronic device other than a cell phone, such as a base station 104. With a base station, a filter of an intermediate frequency (IF) section of a wireless interface device and/or an RF front-end may include a filter circuit 130 as described herein. Usage within a base station may depend on power levels, operating frequency, and so forth. Other electronic device apparatuses that can employ a filter circuit 130 include a laptop, communication hardware of a vehicle, a wireless access point, and so forth as described above.

In example implementations, the filter circuit 130 can include at least one signal manipulator circuit 132 and at least one lattice filter 134. As illustrated, the filter circuit 130 includes a first signal manipulator circuit 132-1, a second signal manipulator circuit 132-2, and multiple lattice filters 134-1 ... 134-L, with L representing a positive integer greater than one (e.g., L can equal two). In some cases, the multiple lattice filters 134-1 ... 134-L are coupled between the first signal manipulator circuit 132-1 and the second signal manipulator circuit 132-2. Example implementations for such filter circuits and lattice filters thereof are described below with reference to FIGS. 3 and 3-1 to 3-6, respectively. Next, however, this document describes example implementations of a transceiver and an RF front-end with reference to FIGS. 2-1 and 2-2.

FIG. 2-1 is a schematic diagram 200-1 illustrating an example transceiver 126 and an example RF front-end 128, each of which may include at least one filter circuit 130. FIG. 2-1 also depicts an antenna 122 and a communication processor 124. The communication processor 124 communicates one or more data signals to other components, such as the application processor 108 of FIG. 1, for further processing at 224 (e.g., for processing at an application level). As shown, the circuitry 200-1 can include a filter circuit 130-1, a filter circuit 130-2, a filter circuit 130-3, or a filter circuit 130-4, including more than one filter circuit 130. The circuitry 200-1, however, may include a different quantity of filters (e.g., more or fewer), may include filters that are coupled together differently, may include filters in different locations, and so forth.

As illustrated from left to right, in example implementations, the antenna 122 is coupled to the RF front-end 128, and the RF front-end 128 is coupled to the transceiver 126. The transceiver 126 is coupled to the communication processor 124. The example RF front-end 128 includes at least one signal propagation path 222. The at least one signal propagation path 222 can include at least one filter circuit 130, such as the filter circuit 130-2 and the filter circuit 130-3. The example transceiver 126 includes at least one receive chain 202 (or receive path 202) and at least one transmit chain 252 (or transmit path 252). Although only one RF front-end 128, one transceiver 126, and one communication processor 124 are shown on the circuitry 200-1, an electronic device 102, or a wireless interface device 120 thereof, can include multiple instances of any or all such components. Also, although only certain components are explicitly depicted in FIG. 2 and are shown coupled together in a particular manner, the transceiver 126 or the RF front-end 128 may include other non-illustrated components (e.g., switches), more or fewer components, differently coupled arrangements of components, and so forth.

In some implementations, the RF front-end 128 couples the antenna 122 to the transceiver 126 via the signal propagation path 222. In operation, the signal propagation path 222 carries a signal between the antenna 122 and the transceiver 126. During or as part of the signal propagation, the signal propagation path 222 conditions the propagating signal, such as with the filter circuit 130-2 or the filter circuit 130-3. This enables the RF front-end 128 to couple a wireless signal 220 from the antenna 122 to the transceiver 126 as part of a reception operation. The RF front-end 128 also enables a transmission signal to be coupled from the transceiver 126 to the antenna 122 as part of a transmission operation to emanate a wireless signal 220. Although not explicitly shown in FIG. 2, an RF front-end 128, or a signal propagation path 222 thereof, may include one or more other components, such as another filter, an amplifier (e.g., a power amplifier or a low-noise amplifier), an N-plexer, a phase shifter, one or more switches and so forth.

In some implementations, the transceiver 126 can include at least one receive chain 202, at least one transmit chain 252, or at least one receive chain 202 and at least one transmit chain 252. The receive chain 202 can include a low-noise amplifier 204 (LNA 204), the filter circuit 130-4, a mixer 208 for frequency down-conversion, and an ADC 210. The transmit chain 252 can include a power amplifier 254 (PA 254), the filter circuit 130-1, a mixer 258 for frequency up-conversion, and a DAC 260. However, the receive chain 202 or the transmit chain 252 can include other components—for example, additional amplifiers or filters, multiple mixers, one or more buffers, or at least one local oscillator—that are electrically disposed anywhere along the depicted receive and transmit chains.

The receive chain 202 is coupled between the signal propagation path 222 of the RF front-end 128 and the communication processor 124—e.g., via the low-noise amplifier 204 and the ADC 210, respectively. The transmit chain 252 is coupled between the signal propagation path 222 and the communication processor 124—e.g., via the power amplifier 254 and the DAC 260, respectively. The transceiver 126 can also include at least one phase-locked loop 232 (PLL 232) that is coupled to the mixer 208 or the mixer 258. For example, the transceiver 126 can include one PLL 232 for each transmit/receive chain pair, one PLL 232 per transmit chain and one PLL 232 per receive chain, multiple PLLs 232 per chain, and so forth.

As shown for certain example implementations of the receive chain 202, the antenna 122 is coupled to the low-noise amplifier 204 via the signal propagation path 222 and the filter circuit 130-3 thereof, and the low-noise amplifier 204 is coupled to the filter circuit 130-4. The filter circuit 130-4 is coupled to the mixer 208, and the mixer 208 is coupled to the ADC 210. The ADC 210 is in turn coupled to the communication processor 124. As shown for certain example implementations of the transmit chain 252, the communication processor 124 is coupled to the DAC 260, and the DAC 260 is coupled to the mixer 258. The mixer 258 is coupled to the filter circuit 130-1, and the filter circuit 130-1 is coupled to the power amplifier 254. The power amplifier 254 is coupled to the antenna 122 via the signal propagation path 222 using the filter circuit 130-2 thereof. Although only one receive chain 202 and one transmit chain 252 are explicitly shown, an electronic device 102, or a transceiver 126 thereof, can include multiple instances of either or both components. Although the ADC 210 and the DAC 260 are illustrated as being separately coupled to the communication processor 124, they may share a bus or other means for communicating with the processor 124.

As part of an example signal-receiving operation, the low-noise amplifier 204 provides an amplified signal to the filter circuit 130-4. The filter circuit 130-4 filters the amplified signal and provides a filtered signal to the mixer 208. The mixer 208 performs a frequency conversion operation on the filtered signal to down-convert from one frequency to a lower frequency (e.g., from a radio frequency (RF) to an intermediate frequency (IF) or to a baseband frequency (BBF)). The mixer 208 can perform the frequency down-conversion in a single conversion step or through multiple conversion steps using at least one PLL 232. The mixer 208 can provide a down-converted signal to the ADC 210 for conversion and forwarding to the communication processor 124 as a digital signal.

As part of an example signal-transmitting operation, the mixer 258 accepts an analog signal at BBF or IF from the DAC 260. The mixer 258 upconverts the analog signal to a higher frequency, such as to an RF frequency, to produce an RF signal using a signal generated by the PLL 232 to have a target synthesized frequency. The mixer 258 provides the RF signal to the filter circuit 130-1, which filters the signal. After filtering by the filter circuit 130-1, the power amplifier 254 provides an amplified signal to the signal propagation path 222 for signal conditioning. The RF front-end 128 can use, for instance, the filter circuit 130-2 of the signal propagation path 222 to provide a filtered signal to the antenna 122 for emanation as a wireless signal 220.

Example implementations of a filter circuit 130, as described herein, may be employed at any one or more of the example filter circuits 130-1, 130-2, 130-3, or 130-4 in the transceiver 126 and the RF front-end 128 or for other filters of an electronic device 102 (not shown in FIG. 2-2). The circuitry 200-1, however, depicts just some examples for a transceiver 126 and/or an RF front-end 128. In some cases, the various components that are illustrated in the drawings using separate schematic blocks or circuit elements may be manufactured or packaged in different discrete manners. For example, one physical module may include components of the RF front-end 128 and some components of the transceiver 126, and another physical module may combine the communication processor 124 with the remaining components of the transceiver 126. Further, in some cases, the antenna 122 may be co-packaged with at least some components of the RF front-end 128 or the transceiver 126. In alternative implementations, one or more components may be physically or logically "shifted" to a different part of the wireless interface device 120 as compared to the circuitry 200-1 and/or may be incorporated into a different module. For example, a low-noise amplifier 204 or a power amplifier 254 may alternatively or additionally be deployed in the RF front-end 128. Examples of this alternative are described next with reference to FIG. 2-2.

FIG. 2-2 is a schematic diagram 200-2 illustrating an example RF front-end 128 that can include one or more filter circuits coupled to at least one amplifier via a switch. As illustrated, the RF front-end 128 is coupled to the antenna 122 via an antenna feed line 276. Between the RF front-end 128 and the antenna 122, the antenna feed line 276 may include a diplexer 274 (or a duplexer in some implementations where Tx and Rx share the antenna). The RF front-end 128 can include a power amplifier 254, a first low-noise amplifier 204-1, and a second low-noise amplifier 204-2. The RF front-end 128 can also include multiple switches, such as a first switch 272-1, a second switch 272-2, and a third switch 272-3. The first switch 272-1 is coupled along a transmit path of a signal propagation path 222 (of FIG. 2-1), and the second switch 272-2 is coupled along a receive path of another signal propagation path 222. Multiple transmit or receive signal propagation paths may be established using the switches.

In example implementations, the RF front-end 128 can further include multiple filter circuits, such as eight filter circuits 130-5 to 130-12. The four filter circuits 130-5, 130-7, 130-9, and 130-11 can be used as part of a transmit path between the power amplifier 254 and the antenna 122, with the transmit path including the antennal feed line 276. The four filter circuits 130-6, 130-8, 130-10, and 130-12 can be used as part of a receive path between the antenna 122 and a low-noise amplifier 204, such as the first low-noise amplifier 204-1 and the second low-noise amplifier 204-2. Thus, the four filter circuits 130-5, 130-7, 130-9, and 130-11 can filter a transmit signal that is output by the power amplifier 254. The four filter circuits 130-6, 130-8, 130-10, and 130-12 can filter a receive signal before the receive signal is input to the first or second low-noise amplifier 204-1 or 204-2.

The transmit and receive paths can be established using one or more of the first, second, or third switches 272-1, 272-2, or 272-3. The communication processor 124 (of FIGS. 1 and 2-1) can position or set the states of these switches based on transmit versus receive mode, a frequency being used for transmission or reception, and so forth. Although certain components are depicted in FIG. 2-2 in a certain arrangement and described above in a particular manner, an RF front-end 128 can include different components, more or fewer components, different couplings, and so forth.

Figure 3:
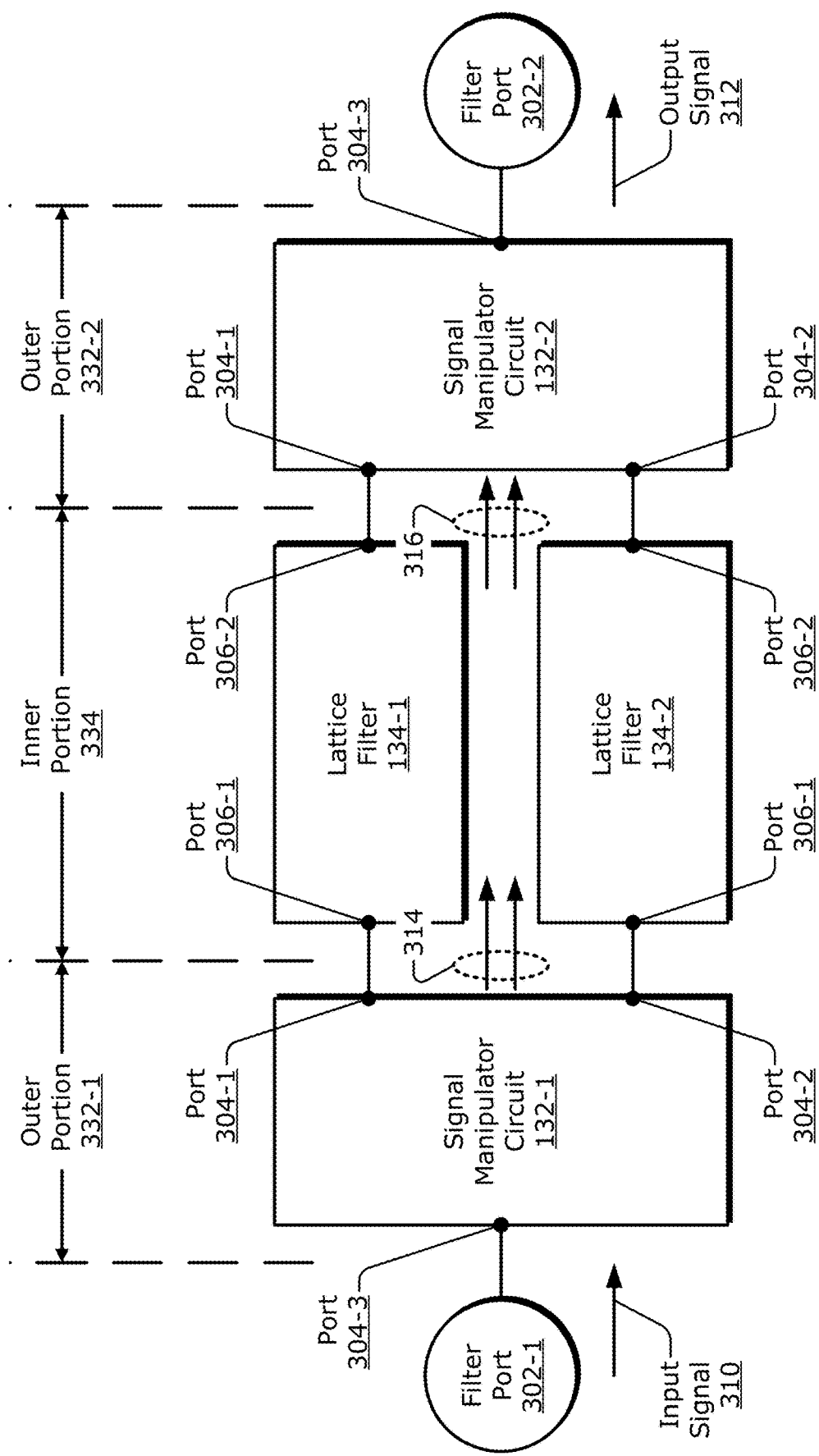
FIG. 3 is a schematic diagram illustrating an example filter circuit having multiple portions that can implement harmonic reduction, including outer signal manipulation circuit portions and an inner filtering portion that includes at least one lattice filter.
Figures 1, 3:
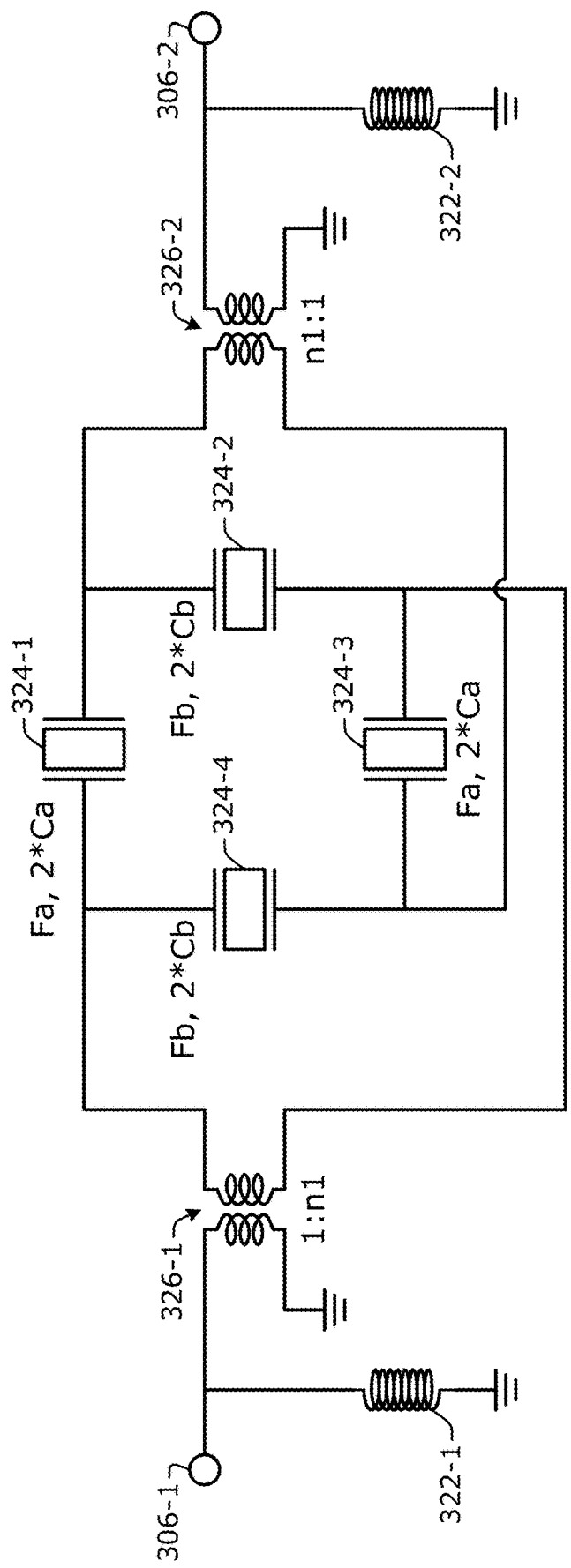
Figures 2, 3:
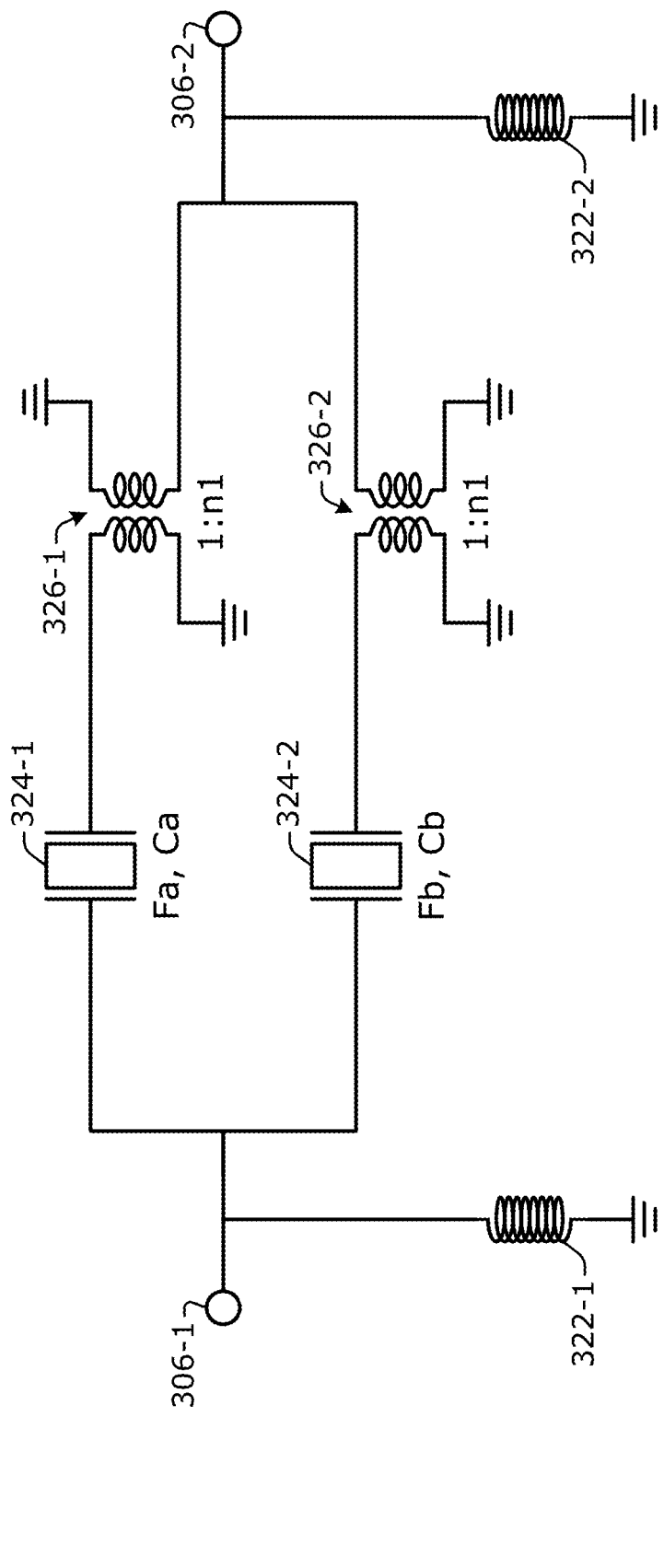
Figure 3:
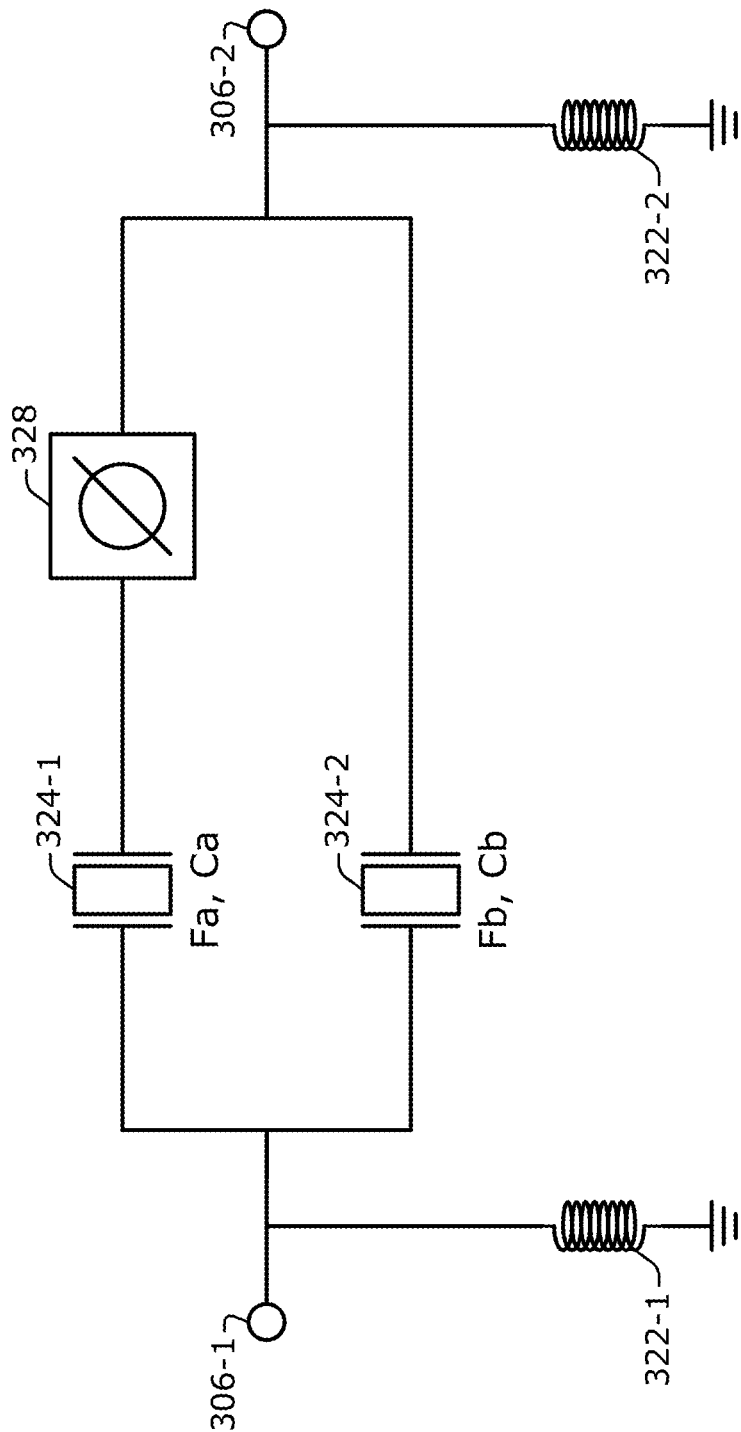

FIG. 3 is a schematic diagram illustrating an example filter circuit 130 having multiple portions that can implement harmonic reduction. These portions can include outer portions 332-1 and 332-2 each with at least one signal manipulator circuit 132 and an inner portion 334 that includes at least one lattice filter 134. The inner filtering portion 334 can perform filtering (e.g., bandpass filtering) using at least one lattice filter 134, such as a first lattice filter 134-1 and a second lattice filter 134-2. The outer signal manipulation portions can include a first outer portion 332-1 that includes a first signal manipulator circuit 132-1 and a second outer portion 332-2 that includes a second signal manipulator circuit 132-2.

In example implementations, the filter circuit 130 includes multiple filter ports, such as a first filter port 302-1 and a second filter port 302-2. The filter circuit 130 also includes the first signal manipulator circuit 132-1, the second signal manipulator circuit 132-2, the first lattice filter 134-1, and the second lattice filter 134-2. Generally, the first signal manipulator circuit 132-1, the second signal manipulator circuit 132-2, the first lattice filter 134-1, and the second lattice filter 134-2 are coupled between the first filter port 302-1 and the second filter port 302-2. The first and second signal manipulator circuits 132-1 and 132-2 are respectively coupled to the first and second filter ports 302-1 and 302-2. The first and second lattice filters 134-1 and 134-2 are coupled between the first and second signal manipulator circuits 132-1 and 132-2.

The first signal manipulator circuit 132-1 includes a first port 304-1, a second port 304-2, and a third port 304-3. The first lattice filter 134-1 includes a first port 306-1 and a second port 306-2. The second lattice filter 134-2 includes a first port 306-1 and a second port 306-2. The second signal manipulator circuit 132-2 includes a first port 304-1, a second port 304-2, and a third port 304-3. These ports may be coupled to one another as described next.

The first port 304-1 of the first signal manipulator circuit 132-1 is coupled to the first port 306-1 of the first lattice filter 134-1. The second port 304-2 of the first signal manipulator circuit 132-1 is coupled to the first port 306-1 of the second lattice filter 134-2. The third port 304-3 of the first signal manipulator circuit 132-1 is coupled to the first filter port 302-1 of the filter circuit 130. The first port 304-1 of the second signal manipulator circuit 132-2 is coupled to the second port 306-2 of the first lattice filter 134-1. The second port 304-2 of the second signal manipulator circuit 132-2 is coupled to the second port 306-2 of the second lattice filter 134-2. The third port 304-3 of the second signal manipulator circuit 132-2 is coupled to the second filter port 302-2 of the filter circuit 130.

In example operations, the filter circuit 130 filters a signal that propagates through the filter circuit 130 from one port to the other port, such as from the first filter port 302-1 to the second filter port 302-2. The two lattice filters 134-1 and 134-2 can filter a propagating signal with a bandpass filter response. Additionally or alternatively, the first lattice filter 134-1 and/or the second lattice filter 134-2 can filter propagating signals with another filter response, such as a low pass response, a high pass response, or a notch response. As shown in FIG. 3, the filter circuit 130 accepts a signal (e.g., a transmit signal or a receive signal) at the first filter port 302-1 as an input signal 310. The first signal manipulator circuit 132-1 accepts the input signal 310 and manipulates the signal to produce multiple manipulated signals 314, which are coupled to the first and second lattice filters 134-1 and 134-2.

To produce the multiple manipulated signals 314, the first signal manipulator circuit 132-1 splits the input signal 310 into two or more split signals. The first signal manipulator circuit 132-1 shifts a phase of at least one split signal of the multiple split signals to create a phase difference between two or more split signals of the multiple split signals. The phase difference or phase separation between the split signals may correspond, for example, to ninety degrees (90°) or one hundred and eighty degrees (180°). Example implementations for a signal manipulator circuit 132 are described below with reference to FIGS. 4-1 and 4-2.

The filter circuit 130 couples the multiple manipulated signals 314 from the first signal manipulator circuit 132-1 to the first and second lattice filters 134-1 and 134-2. The first lattice filter 134-1 filters one of the manipulated or split signals to produce a filtered signal. The second lattice filter 134-2 filters another one of the manipulated or split signals to produce another filtered signal. The first and second lattice filters 134-1 and 134-2 can be constructed at least similarly so as to have similar filtering parameters. For example, each lattice filter 134 can have a substantially similar bandwidth and attenuation characteristics. Accordingly, the first and second lattice filters 134-1 and 134-2 can produce multiple filtered signals 316 and forward these multiple filtered signals 316 to the second signal manipulator circuit 132-2.

The second signal manipulator circuit 132-2 accepts the multiple filtered signals 316 and produces an output signal 312, which is coupled to the second filter port 302-2 of the filter circuit 130. The second signal manipulator circuit 132-2 shifts a phase of at least one filtered signal of the multiple filtered signals 316. The second signal manipulator circuit 132-2 uses the phase shifting to realign the phases of the fundamental frequency of the split signals for constructive combination. The second signal manipulator circuit 132-2 also merges the fundamental-frequency-aligned split signals to produce the output signal 312. Harmonic frequencies, however, are not necessarily realigned for constructive combination by the phase shifting of the second signal manipulator circuit 132-2.

As described herein, at least one harmonic frequency can be destructively combined based on the joint operation of the first and second signal manipulator circuits 132-1 and 132-2. For example, if the first and second signal manipulator circuits 132-1 and 132-2 shift the phases of the signals by a relative 180° (e.g., by using a 180° hybrid coupler), a second harmonic signal will be substantially reduced by joint operation of the two manipulator circuits. On the other hand, if the first and second signal manipulator circuits 132-1 and 132-2 shift the phases of the signals by a relative 90° (e.g., by using a 90° hybrid coupler), a third harmonic signal will be substantially reduced by joint operation of the two manipulator circuits. Accordingly, the two outer portions 332-1 and 332-2 can in combination at least reduce the second harmonic or the third harmonic of a fundamental frequency.

To achieve a reduction in both the second harmonic and the third harmonic, the inner portion 334 can reduce the opposite harmonic. Thus, if the two outer portions 332-1 and 332-2 are reducing the second harmonic, the inner portion 334 can reduce the third harmonic. Likewise, if the two outer portions 332-1 and 332-2 are reducing the third harmonic, the inner portion 334 can reduce the second harmonic. With these arrangements, the circuitry between the first and second filter ports 302-1 and 302-2 can reduce the second harmonic and the third harmonic.

In some implementations, each lattice filter 134 can be replaced with an internal set of circuitry that includes its own pair of outer portions 332-1 and 332-2 and an inner portion 334. In such implementations, the innermost portion can include any filter. Further, the internally nested signal manipulator circuits are architected to cancel the second harmonic if the outer signal manipulator circuits are architected to cancel the third harmonic, and vice versa. These nested signal manipulator circuit implementations can, therefore, substantially reduce the second harmonic and the third harmonic.

In other implementations, each lattice filter 134 can be architected to reduce the second harmonic or the third harmonic. Examples of circuits to achieve second or third harmonic reduction using a lattice filter 134 are described next with reference to FIGS. 3-1 to 3-6. Circuit examples with half lattice filters and full lattice filters are described. At least some of the lattice filters can be formed with one or more acoustic resonators.

FIGS. 3-1 to 3-6 depict examples of a lattice filter 134, which can be employed in the filter circuit 130 of FIG. 3. FIG. 3-1 is a circuit diagram 300-1 illustrating an example of a full lattice filter. FIGS. 3-2 to 3-6 are circuit diagrams 300-2 to 300-6 illustrating examples of a half lattice filter. Each lattice filter includes at least two acoustic resonators coupled between first and second ports 306-1 and 306-2. These two or more acoustic resonators can include, for example, a first acoustic resonator 324-1, a second acoustic resonator 324-2, a third acoustic resonator 324-3, and/or a fourth acoustic resonator 324-4. The various alternative lattice filter implementations may also include one or more transformers or at least one phase shifter. The windings of each transformer may have the ratio (e.g., 1:n1 or n1:1) indicated in the drawings.

Each of the at least two acoustic resonators can have one of two different resonance frequencies (e.g., Fa and Fb) and two different impedances, such as two different static capacitances Ca and Cb. The capacitances Ca and Cb may be equal to each other to produce transmission zeros at 0 hertz (Hz) and infinity, or the capacitances Ca and Cb may be different from each other to produce finite transmission zeros in the response. The acoustic resonators can have a capacitance as indicated in the figures, such as Ca, Cb, or a multiple thereof (e.g. 4*Cb). Each lattice filter 134 can include a first inductor 322-1 coupled to the first port 306-1 and a second inductor 322-2 coupled to the second port 306-2. The two inductors 322-1 and 322-2 can be included to widen the passband of the lattice filter 134. Otherwise, the two inductors 322-1 and 322-2 may be omitted. Any of the example lattice filter implementations can be architected to provide substantially the same small signal response with appropriately dimensioned circuit elements.

In FIG. 3-1, an example full lattice filter is shown with four acoustic resonators 324-1, 324-2, 324-3, and 324-4 and two transformers 326-1 and 326-2 at a circuit diagram 300-1. A first transformer 326-1 is coupled to the first port 306-1, and a second transformer 326-2 is coupled to the second port 306-2. The four acoustic resonators 324-1, 324-2, 324-3, and 324-4 are coupled together into a square or loop. The square is coupled between the two transformers 326-1 and 326-2 with the acoustic resonator 324-3 being cross-coupled to the transformers. If the full lattice filter 300-1 is connected to first and second differential ports, the filter can be operated without the transformers.

In FIG. 3-2, a first example variant of a half lattice filter is shown with two acoustic resonators 324-1 and 324-2 and two transformers 326-1 and 326-2. As illustrated in a circuit diagram 300-2, a first transformer 326-1 and a second transformer 326-2 are coupled to the second port 306-2. A first acoustic resonator 324-1 and a second acoustic resonator 324-2 are coupled to the first port 306-1. The first acoustic resonator 324-1 and the first transformer 326-1 are coupled together in series between the first and second ports 306-1 and 306-1. The second acoustic resonator 324-2 and the second transformer 326-2 are coupled together in series between the first and second ports 306-1 and 306-1. Thus, the series-connected first acoustic resonator 324-1 and first transformer 326-1 are coupled in parallel with the series-connected second acoustic resonator 324-2 and second transformer 326-2. In example operations, based on the illustrated connections of the transformers, the first transformer 326-1 implements a 180° phase shift, and the second transformer 326-2 implements a 0° (zero or no) phase shift.

In FIG. 3-3, a different version of the first example variant of a half lattice filter (of FIG. 3-2) is shown with two acoustic resonators 324-1 and 324-2 and at least one phase shifter 328. The two transformers of the circuit diagram 300-2 can be replaced with the phase shifter 328 of the circuit diagram 300-3. From a physical implementation perspective in which components are fabricated from nonideal elements, the two transformers can be replaced with a single phase shifter if the phase shifter is frequency invariant across the frequency range of interest, but such a phase shifter may not be readily realizable using lumped elements or transmission lines if the desired frequency range is wide. In other words, using an inductive-capacitive based (L-C based) phase shifter can appreciably limit the maximum bandwidth and the out-of-band attenuation. Accordingly, a more viable frequency invariant phase shifter that operates at 180° is an ideal transformer. If using a non-ideal transformer, the smaller-than-one coupling can be compensated for by including another transformer with a nominal 0° phase shift—as shown in FIG. 3-2. However, it should be appreciated that there may be a variety of applications and/or implementations in which the half lattice filter may be implemented with a phase shifter as illustrated in FIG. 3-3.

Figures 3, 4:
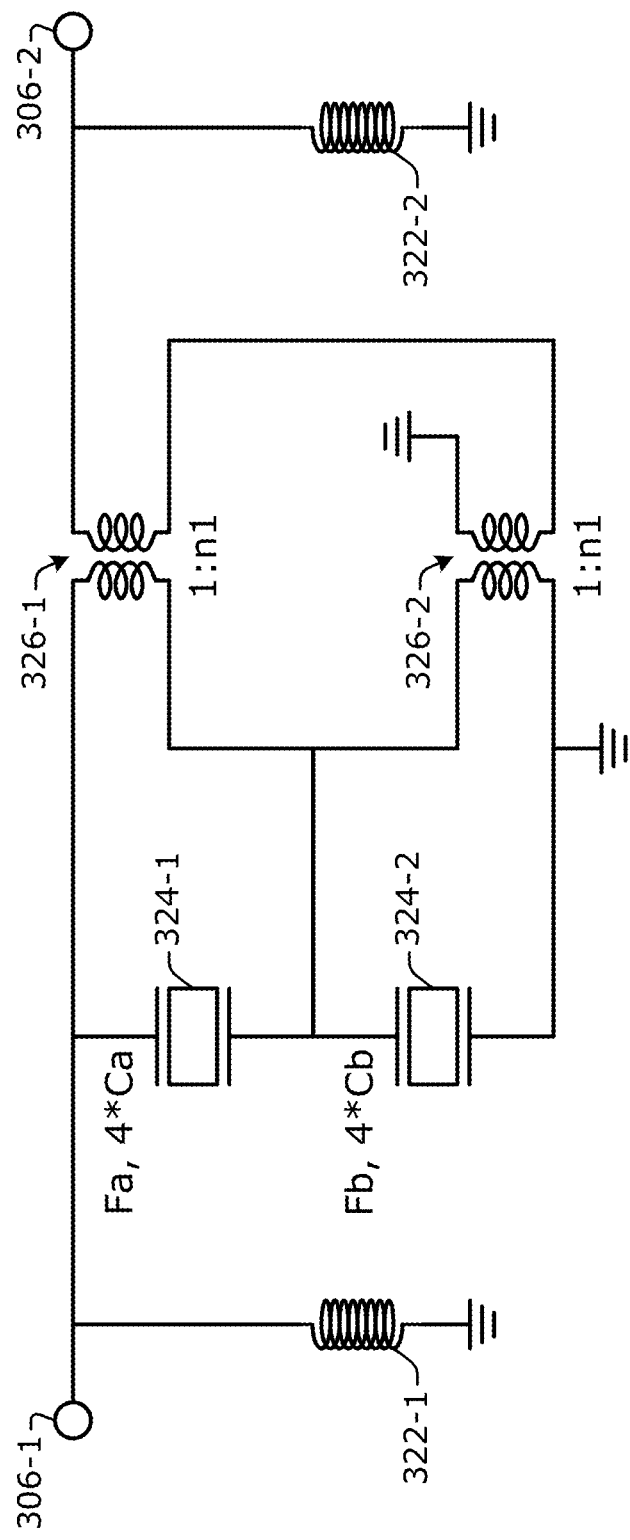
Figures 3, 4, 5:
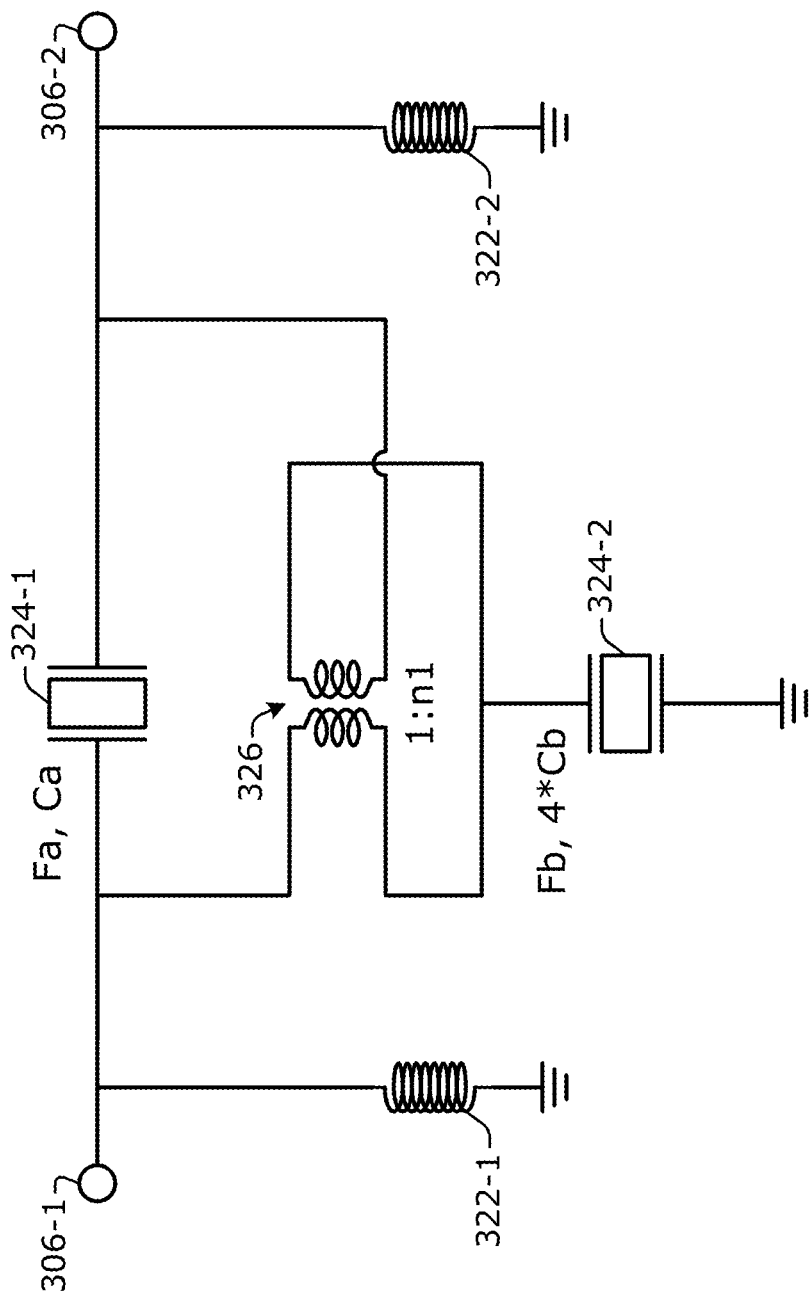

In FIG. 3-4, a second example variant of a half lattice filter is shown as a circuit diagram 300-4. This second example variant, like the first one, also includes two acoustic resonators 324-1 and 324-2 and two transformers 326-1 and 326-2. In FIG. 3-5, a third example variant of a half lattice filter is shown as a circuit diagram 300-5. This third example variant includes two acoustic resonators 324-1 and 324-2 and at least one transformer 326. Here, the first acoustic resonator 324-1 may be swapped with the second acoustic resonator 324-2.

In FIG. 3-6, a fourth example variant of a half lattice filter is shown as a circuit diagram 300-6. This fourth example variant, like the first and second ones, includes two acoustic resonators 324-1 and 324-2 and two transformers 326-1 and 326-2. A first acoustic resonator 324-1 is coupled between the first and second ports 306-1 and 306-2. A second acoustic resonator 324-2 is coupled in series with, and in between, first and second transformers 326-1 and 326-2. This series-connected set of three elements is also coupled between the first and second ports 306-1 and 306-2. Thus, the series-connected set of three elements and the first acoustic resonator 324-1 are coupled together in parallel between the first and second ports 306-1 and 306-2.

FIG. 4-1 is a schematic diagram 400-1 including example signal manipulation circuits 132-1 and 132-2 that each have at least one hybrid coupler 402. As shown, each hybrid coupler 402 is coupled between the first and second lattice filters 134-1 and 134-2 and a respective filter port 302. Each hybrid coupler 402 can split or merge signals, depending on a direction of signal propagation. The hybrid coupler 402 can also create a phase difference between two split signals or remove a phase difference from signals being merged. The phase shift can be, for example, 90° or 180°. Thus, each hybrid coupler 402 can comprise a ninety-degree (90°) hybrid coupler or a one-hundred-and-eighty-degree (180°) hybrid coupler.

In example implementations with hybrid couplers, each signal manipulator circuit 132 includes a fourth port 304-4, and the filter circuit 130 can include at least one load component 406 (e.g., a resistor or other static impedance element). The fourth port 304-4 of the first signal manipulator circuit 132-1 is coupled to a first load component 406-1, which is also coupled to a ground 408. The third port 304-3 of the first signal manipulator circuit 132-1 is coupled to the first filter port 302-1. With respect to the second signal manipulator circuit 132-2, the fourth port 304-4 is coupled to the second filter port 302-2, and the third port 304-3 is coupled to a second load component 406-2. The second load component 406-2 is coupled between the third port 304-3 and the ground 408.

A first hybrid coupler 402-1 includes a first hybrid port 404-1, a second hybrid port 404-2, a third hybrid port 404-3, and a fourth hybrid port 404-4. The first hybrid port 404-1 of the first hybrid coupler 402-1 is coupled to the first port 304-1 of the first signal manipulator circuit 132-1. The second hybrid port 404-2 of the first hybrid coupler 402-1 is coupled to the second port 304-2 of the first signal manipulator circuit 132-1. The third hybrid port 404-3 of the first hybrid coupler 402-1 is coupled to the third port 304-3 of the first signal manipulator circuit 132-1. The fourth hybrid port 404-4 of the first hybrid coupler 402-1 is coupled to the fourth port 304-4 of the first signal manipulator circuit 132-1. The first load component 406-1 is coupled between the fourth hybrid port 404-4 and the ground 408.

A second hybrid coupler 402-2 includes a first hybrid port 404-1, a second hybrid port 404-2, a third hybrid port 404-3, and a fourth hybrid port 404-4. The first hybrid port 404-1 of the second hybrid coupler 402-2 is coupled to the first port 304-1 of the second signal manipulator circuit 132-2. The second hybrid port 404-2 of the second hybrid coupler 402-2 is coupled to the second port 304-2 of the second signal manipulator circuit 132-2. The third hybrid port 404-3 of the second hybrid coupler 402-2 is coupled to the third port 304-3 of the second signal manipulator circuit 132-2. The fourth hybrid port 404-4 of the second hybrid coupler 402-2 is coupled to the fourth port 304-4 of the second signal manipulator circuit 132-2. The second load component 406-2 is coupled between the third hybrid port 404-3 of the second hybrid coupler 402-2 and the ground 408.

In example operations, the first hybrid coupler 402-1 outputs a first manipulated signal and a second manipulated signal of the multiple manipulated signals 314. If the first hybrid coupler 402-1 comprises a ninety-degree (90°) hybrid coupler, the first manipulated signal and the second manipulated signal have respective phases that are approximately ninety degrees (90°) apart from each other. If the first hybrid coupler 402-1 comprises a one-hundred-and-eighty-degree (180°) hybrid coupler, the first manipulated signal and the second manipulated signal have respective phases that are approximately one hundred and eighty degrees (180°) apart from each other. The second hybrid coupler 402-2 can operate in the inverse manner by merging the multiple filtered signals 316 in conjunction with causing phase shifts of 90° or 180°. Example mechanisms for substantially reducing the second or third harmonic based on the joint operation of the first and second hybrid couplers 402-1 and 402-2 are described below in terms of power dividers/combiners and phase shifters with reference to FIG. 4-2.

FIG. 4-2 is a schematic diagram 400-2 including example signal manipulation circuits 132-1 and 132-2 that each have at least one power divider/combiner 452/456 and at least one phase shifter 454. These power divider/combiner and phase shifter components can operate to reduce a second or third harmonic as described below. As shown, the first signal manipulator circuit 132-1 includes a power divider 452, a first phase shifter 454-1, and a second phase shifter 454-2. The power divider 452 includes an input 462, a first output 464-1, and a second output 464-2. The second signal manipulator circuit 132-2 includes a power combiner 456, a first phase shifter 454-1, and a second phase shifter 454-2. The power combiner 456 includes a first input 462-1, a second input 462-2, and an output 464.

In example implementations, the input node 462 of the power divider 452 is coupled to the third port 304-3 of the first signal manipulator circuit 132-1. The first phase shifter 454-1 of the first signal manipulator circuit 132-1 is coupled between the first output node 464-1 of the power divider 452 and the first port 304-1 of the first signal manipulator circuit 132-1. The second phase shifter 454-2 of the first signal manipulator circuit 132-1 is coupled between the second output node 464-2 and the second port 304-2 of the first signal manipulator circuit 132-1.

With respect to the second signal manipulator circuit 132-2, the output node 464 of the power combiner 456 is coupled to the third port 304-3 of the second signal manipulator circuit 132-2. The first phase shifter 454-1 of the second signal manipulator circuit 132-2 is coupled between the first port 304-1 of the second signal manipulator circuit 132-2 and the first input node 462-1 of the power combiner 456. The second phase shifter 454-2 of the second signal manipulator circuit 132-2 is coupled between the second port 304-2 of the second signal manipulator circuit 132-2 and the second input node 462-2 of the power combiner 456.

In some implementations, the first signal manipulator circuit 132-1 and the second signal manipulator circuit 132-2 can jointly at least attenuate at the output signal 312 a third-order harmonic that is generated based on the input signal 310 by at least one of the first lattice filter 134-1 or the second lattice filter 134-2. To do so, the first phase shifter 454-1 of the first signal manipulator circuit 132-1 can shift a phase of a first split signal of multiple split signals present within the first signal manipulator circuit 132-1 (e.g., as output by the power divider 452) by approximately positive forty-five degrees (+45°). The second phase shifter 454-2 can shift a phase of a second split signal of the multiple split signals by approximately negative forty-five degrees (−45°). Alternatively, one phase shifter can be employed to shift one split signal by approximately ninety degrees (90°) relative to another split signal to reduce a component count. However, two identical, or at least similar, phase shifters may produce more balanced signaling. These implementations can correspond to a 90° hybrid coupler for FIG. 4-1.

In other implementations, the first signal manipulator circuit 132-1 and the second signal manipulator circuit 132-2 are jointly configured to at least attenuate at the output signal 312 a second-order harmonic that is generated based on the input signal 310 by at least one of the first lattice filter 134-1 or the second lattice filter 134-2. To do so, the first phase shifter 454-1 is configured to shift a phase of a first split signal of the multiple split signals within the first signal manipulator circuit 132-1 by approximately positive ninety degrees)(+90°. The second phase shifter 454-2 is configured to shift a phase of a second split signal of the multiple split signals by approximately negative ninety degrees (−90°). Alternatively, one phase shifter can be employed to shift one split signal by approximately one hundred and eighty degrees (180°) relative to another split signal. These implementations can correspond to a 180° hybrid coupler deployed as at least part of the first signal manipulator circuit 132-1 (with another 180° hybrid coupler deployed for the second signal manipulator circuit 132-2) of FIG. 4-1.

The harmonic reduction provided by the first signal manipulator circuit 132-1 in conjunction with the second signal manipulator circuit 132-2 is described in terms of a third harmonic signal, which involves creating a 90° phase difference between split signals. Analogous principles, however, are applicable to reducing a second harmonic signal by using a 180° phase difference. With reference to FIG. 4-2, the power divider 452 generates two split signals at the first and second outputs 464-1 and 464-2. Before the phase shifting, these two fundamentals are in-phase. After the first phase shifting by the first and second phase shifters 454-1 and 454-2 of the first signal manipulator circuit 132-1, the two split signals have been manipulated to have a 90° phase difference. The first and second phase shifters 454-1 and 454-2 can create the 90° phase difference using, for instance, +45° and −45° phase shifts. Thus, the first and second lattice filters 134-1 and 134-2 accept the two split and manipulated signals with phases that are separated by 90°.

The first and second lattice filters 134-1 and 134-2 output multiple filtered signals 316, which now include one or more harmonics in conjunction with the fundamental frequency. These harmonics can include a third-order harmonic. Thus, after the first phase shifting of the first signal manipulator circuit 132-1, at the output of the two lattice filters 134-1 and 134-2, the two fundamentals still have a 90° phase difference. The third-order harmonic components are each in-phase with their fundamental. Accordingly, the two third-order harmonics have a relative 270° phase difference at the first port 304-1 and the second port 304-2 of the second signal manipulator circuit 132-2. The relative 270° phase difference between the two third-order harmonics, which is three times the 90° phase difference of the fundamentals, develops because the two third-order harmonics have one-third (⅓) the wavelength of the two fundamentals.

The first and second phase shifters 454-1 and 454-2 of the second signal manipulator circuit 132-2 operate on the multiple filtered signals 316. After this second phase shifting of a relative 90°, the fundamentals are again in-phase. The first and second phase shifters 454-1 and 454-2 of the second signal manipulator circuit 132-2 can create the 90° phase difference using, for instance, −45° and +45° phase shifts, which are flipped as compared to those of the first signal manipulator circuit 132-1 to shift the fundamental back into alignment. In contrast, the third-order harmonic components are out-of-phase by 180° after the 90° relative shift by the first and second phase shifters 454-1 and 454-2 of the second signal manipulator circuit 132-2. The phase-shifted split signals are coupled to the first and second inputs 462-1 and 462-2 of the power combiner 456.

The power combiner 456 merges the split signals to rejoin the fundamentals, which are in-phase. Responsive to the third-order harmonic signal merging by the power combiner 456, the two third-order harmonics can substantially cancel each other because they are 180° out-of-phase with each other. In these manners, a third-order harmonic can at least be reduced by operation of the first and second signal manipulator circuits 132-1 and 132-2 with relative 90° phase shifts. Further, a second-order harmonic can at least be reduced by operation of the first and second signal manipulator circuits 132-1 and 132-2 with relative 180° phase shifts.

FIG. 5 is a schematic diagram 500 illustrating an example half lattice filter. The lattice filter 134 of FIG. 5 represents an example half lattice filter implementation that can be similar to that of FIG. 3-3. Thus, the operation and principles described with regard to the schematic diagram 500 can also apply to the example half lattice filter implementation of FIG. 3-2 or 3-3. As shown, the lattice filter 134 can include a first signal path 502-1 and a second signal path 502-2. Each signal path 502 can include at least one resonator circuit 504. The first and second signal paths 502-1 and 502-2 are coupled between the first and second ports 306-1 and 306-2.

In example implementations, a lattice filter 134—including a half lattice filter as depicted—can be realized using one or more acoustic resonators. Each resonator circuit 504 can therefore include at least one acoustic resonator (not shown in FIG. 5). The first signal path 502-1 can include at least a first resonator circuit 504-1 and a phase shifter 506. The second signal path 502-2 can include at least a second resonator circuit 504-2. With reference to FIGS. 3-2 and 3-3, the phase shifter 506 can be realized with a transformer, such as the first transformer 326-1 of FIG. 3-2. Further, the second signal path 502-2 can include a component that provides a zero-degree (0°) phase shift, such as the second transformer 326-2 of FIG. 3-2, to balance the circuit.

Continuing with FIG. 5, the first inductor 322-1 is coupled between the ground 408 and the first port 304-1 (e.g., also of FIGS. 3, 4-1, and 4-2) of the first signal manipulator circuit 132-1 at a node located between the first signal manipulator circuit 132-1 and the lattice filter 134. The first port 306-1 of the lattice filter 134 can accept the manipulated signal 314. The second inductor 322-2 is coupled between the ground 408 and the first port 304-1 (e.g., also of FIGS. 3, 4-1, and 4-2) of the second signal manipulator circuit 132-2 at another node located between the second signal manipulator circuit 132-2 and the lattice filter 134. The second port 306-2 of the lattice filter 134 can provide the filtered signal 316.

Thus, the first signal path 502-1 is coupled between the first port 304-1 of the first signal manipulator circuit 132-1 and the first port 304-1 of the second signal manipulator circuit 132-2. The second signal path 502-2 is also coupled between the first port 304-1 of the first signal manipulator circuit 132-1 and the first port 304-1 of the second signal manipulator circuit 132-2. With respect to the first signal path 502-1, the first resonator circuit 504-1 and the phase shifter 506 are coupled together in series between the first port 304-1 of the first signal manipulator circuit 132-1 and the first port 304-1 of the second signal manipulator circuit 304-1.

The first resonator circuit 504-1 can include at least one acoustic resonator, and the second resonator circuit 504-2 can also include at least one acoustic resonator. Example implementations of the resonator circuits with one or more acoustic resonators are described next with reference to FIGS. 5-1 to 5-3, including some implementations that can substantially reduce, if not approximately fully cancel, a second-order harmonic.

FIG. 5-1 is a circuit diagram 500-1 illustrating an example half lattice filter with multiple acoustic resonators. In example implementations, each resonator circuit 504 includes at least one acoustic resonator 520. As shown, the first resonator circuit 504-1 includes a first acoustic resonator 520-1, and the second resonator circuit 504-2 includes a second acoustic resonator 520-2. Each acoustic resonator 520 can include a first electrode 522-1, a second electrode 522-2, and at least one piezoelectric material 524. The piezoelectric material 524 has a crystal axis 526 with a direction of crystal orientation. Each acoustic resonator 520 can be similar to, or even the same as, each acoustic resonator 324 (e.g., of FIGS. 3-1 to 3-6).

In some implementations, each resonator circuit 504 can include a first acoustic resonator and a second acoustic resonator coupled to the first acoustic resonator. In such cases, the first and second acoustic resonators can be substantially the same. For example, the first acoustic resonator can correspond to a frequency and have a capacitance. The second acoustic resonator likewise corresponds to the frequency and has the capacitance—e.g., corresponds to the same frequency and has the same capacitance. If the first and second acoustic resonators are appropriately coupled together relative to the crystal axis of the piezoelectric material 524, the first acoustic resonator and the second acoustic resonator can jointly at least attenuate a second-order harmonic that is generated by the first acoustic resonator individually and the second acoustic resonator individually. Examples of such acoustic-resonator-based circuits that can reduce a second harmonic signal are described with reference to FIGS. 5-2 and 5-3.

FIG. 5-2 is a circuit diagram 500-2 illustrating an example half lattice filter with acoustic resonators that are connected in "anti-series." In example implementations, the first and second resonator circuits 504-1 and 504-2 can include four acoustic resonators 520-1, 520-2, 520-3, and 520-4, such as two acoustic resonators per resonator circuit 504. The "anti-series" connection is described in terms of the first resonator circuit 504-1, but the principles are also applicable to the second resonator circuit 504-2. In example implementations, a resonance frequency of the first acoustic resonator 520-1 can be substantially equal to a resonance frequency of the second acoustic resonator 520-3. Similarly, a static capacitance of the first acoustic resonator 520-1 can be substantially equal to a static capacitance of the second acoustic resonator 520-3. This can also be implemented for the second resonator circuit 504-2 and/or for the resonator circuit(s) of FIG. 5-3, which have an internal parallel relationship. In some cases, such values are substantially equal if they are architected to be the same (and therefore differ based on variances arising from fabrication) and/or if they are within 10%, or even within 3% or 5%, of each other.

As shown, the first resonator circuit 504-1 includes a first acoustic resonator 520-1 and a second acoustic resonator 520-3. The first acoustic resonator 520-1 and the second acoustic resonator 520-3 are coupled together in anti-series between the first port 304-1 (e.g., of FIGS. 3, 4-1, 4-2, and 5) of the first signal manipulator circuit 132-1 and the first port 304-1 of the second signal manipulator circuit 132-2. The first acoustic resonator 520-1 and the second acoustic resonator 520-3 are also coupled together in anti-series between the first and second ports 306-1 and 306-2 of the half lattice filter. The two acoustic resonators 520-1 and 520-3 can be arranged to have a virtually inverted crystal axis orientation relative to each other. During operation, this relative virtual axis inversion can enable the two acoustic resonators to at least reduce, if not substantially cancel, the second-order harmonic of a signal propagating through the half lattice filter.

In some implementations, with reference to FIGS. 5-1 and 5-2, the first acoustic resonator 520-1 includes a first electrode 522-1, a second electrode 522-2, and a piezoelectric material 524 coupled to the first electrode 522-1 and the second electrode 522-2. The piezoelectric material 524 has a crystal axis 526 that is directed from the first electrode 522-1 to the second electrode 522-2. The second acoustic resonator 520-3 includes a first electrode 522-1, a second electrode 522-2, and a piezoelectric material 524 coupled to the first electrode 522-1 and the second electrode 522-2 of the second acoustic resonator 520-3. With a BAW acoustic resonator, the piezoelectric material 524 can be coupled at least partially between the first electrode 522-1 and the second electrode 522-2. The piezoelectric material 524 of the second acoustic resonator 520-3 has a crystal axis 526 that is directed from the first electrode 522-1 to the second electrode 522-2 of the second acoustic resonator 520-3. The first acoustic resonator 520-1 is coupled in series with the second acoustic resonator 520-3. The second electrode 522-2 of the first acoustic resonator 520-1 is coupled to the second electrode 522-2 of the second acoustic resonator 520-3 so as to cause the crystal axes to be virtually inverted relative to each other—e.g., the respective crystal orientations are pointing in opposite directions with regard to an electromagnetic field that is applied across the acoustic resonators and/or with regard to a current that is propagated through the acoustic resonators.

With continuing reference to FIG. 5-2, the first acoustic resonator 520-1 is aligned in a virtually opposite direction relative to the second acoustic resonator 520-3 from a crystal axis perspective to at least reduce the second-order harmonic. More specifically, the crystal axis of the first acoustic resonator 520-1, or a first crystal orientation, is aligned virtually opposite to the crystal axis of the second acoustic resonator 520-3, or a second crystal orientation. Due to the virtual opposite alignment of the respective crystal axes of the two acoustic resonators, and responsive to applying a signal to the first acoustic resonator 520-1 and the second acoustic resonator 520-3, the virtually inverted crystal axes cause the first acoustic resonator 520-1 to expand while the second acoustic resonator 520-3 contracts, and vice versa. This opposite expansion and contraction can operate to substantially cancel the second harmonic.

Generally, the first acoustic resonator 520-1 includes at least one piezoelectric material 524 having a crystal axis 526, and the second acoustic resonator 520-3 includes at least one piezoelectric material 524 having another crystal axis 526. The first and second acoustic resonators 520-1 and 520-3 can be electrically connected such that respective electric fields within the at least one piezoelectric material 524 of the first and second acoustic resonators 520-1 and 520-3 are virtually opposite in phase with regard to the respective crystal axis 526 of each acoustic resonator 520 of the first and second acoustic resonators 520-1 and 520-3.

This operation, and the concomitant effect of canceling the second harmonic, is described above in terms primarily of an "anti-series" connection. The principles, operation, and effect are analogous with an "anti-parallel" connection, which is described next with reference to FIG. 5-3.

FIG. 5-3 is a circuit diagram 500-3 illustrating an example half lattice filter with acoustic resonators that are connected in "anti-parallel." In example implementations, the first and second resonator circuits 504-1 and 504-2 can include four acoustic resonators 520-1, 520-2, 520-3, and 520-4, such as two acoustic resonators per resonator circuit 504. The "anti-parallel" connection is described in terms of the second resonator circuit 504-2, but the principles are also applicable to the first resonator circuit 504-1.

As shown, the second resonator circuit 504-2 includes a first acoustic resonator 520-2 and a second acoustic resonator 520-4. The first acoustic resonator 520-2 and the second acoustic resonator 520-4 are coupled together in anti-parallel between the first port 304-1 (e.g., of FIGS. 3, 4-1, 4-2, and 5) of the first signal manipulator circuit 132-1 and the first port 304-1 of the second signal manipulator circuit 132-2. Similarly, with regard to the first resonator circuit 504-1, the first acoustic resonator 520-1 and the second acoustic resonator 520-3 are coupled together in anti-parallel between the first port 304-1 (e.g., of FIGS. 3, 4-1, 4-2, and 5) of the first signal manipulator circuit 132-1 and the first port 304-1 of the second signal manipulator circuit 132-2 via a series connection with the phase shifter 506 (e.g., along the first signal path 502-1 of FIG. 5).

As shown in FIG. 5-3 for the second resonator circuit 504-2, the crystal axis 526 of the first acoustic resonator 520-2 has a virtually opposite direction or crystal orientation as compared to the crystal axis 526 of the second acoustic resonator 520-4. The crystal axis 526 of the first acoustic resonator 520-2 points from the first port 306-1 to the second port 306-2. In contrast, the crystal axis 526 of the second acoustic resonator 520-4 points from the second port 306-2 to the first port 306-1. Examples of operational voltages and currents for both anti-series and anti-parallel connections of acoustic resonators are described below with reference to FIGS. 6-2 and 6-3.

Figures 3, 4, 5, 6:
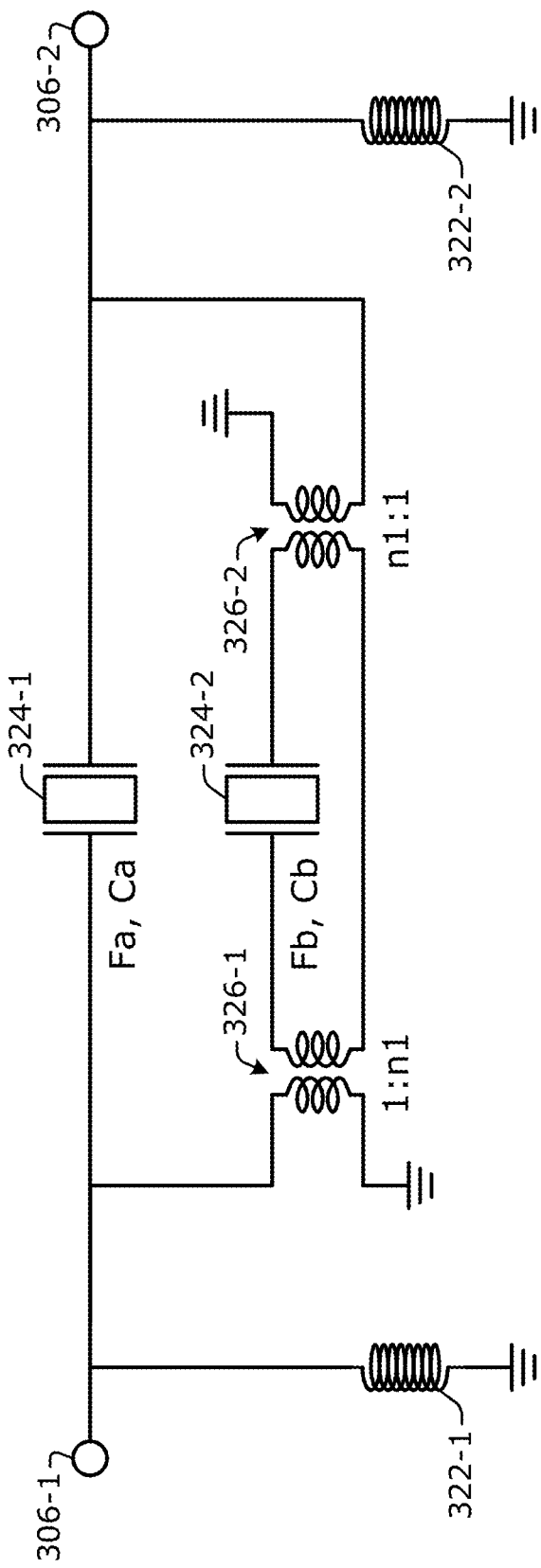
Figures 1, 4:
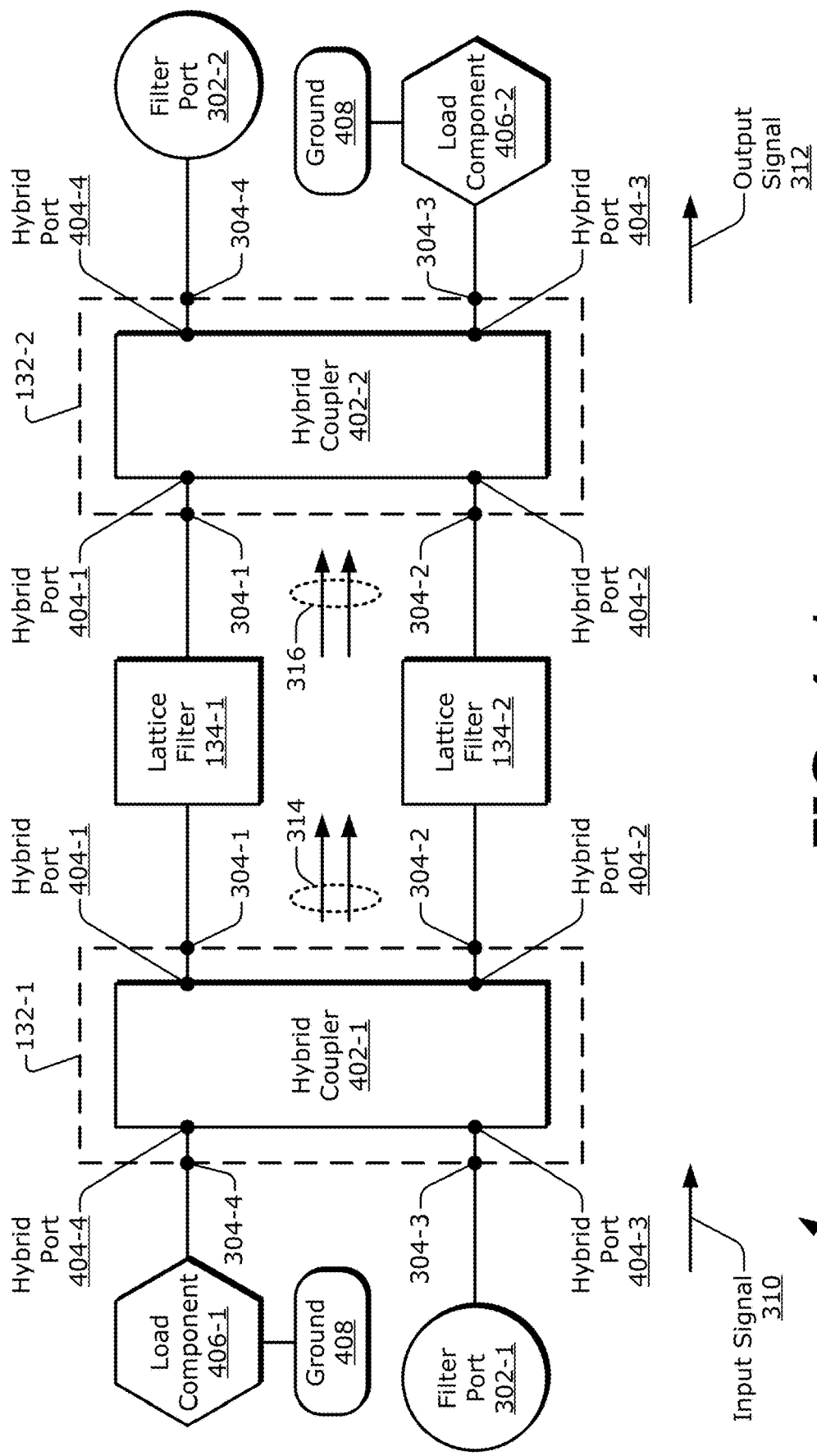
Figures 2, 4:
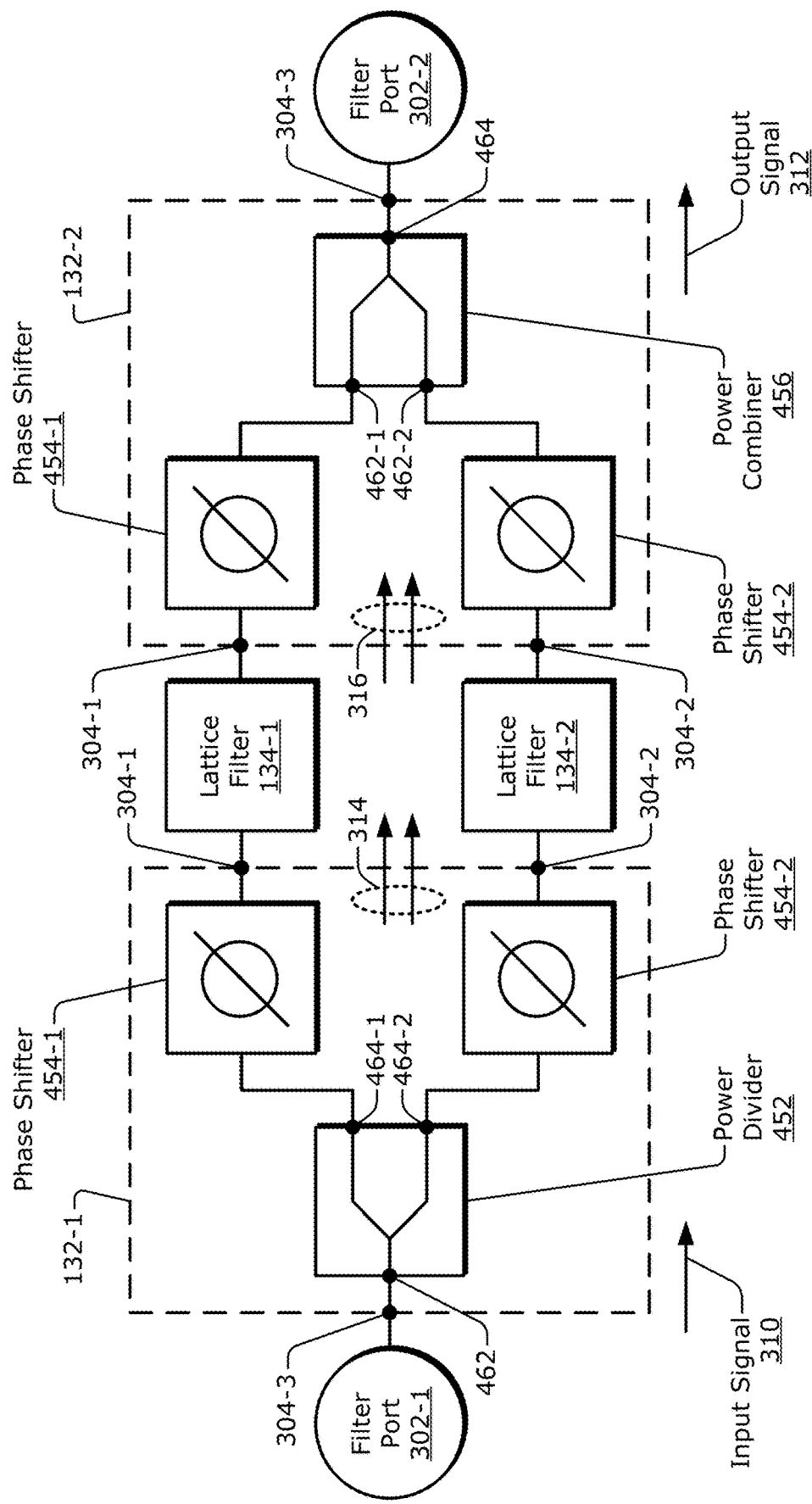
Figure 5:
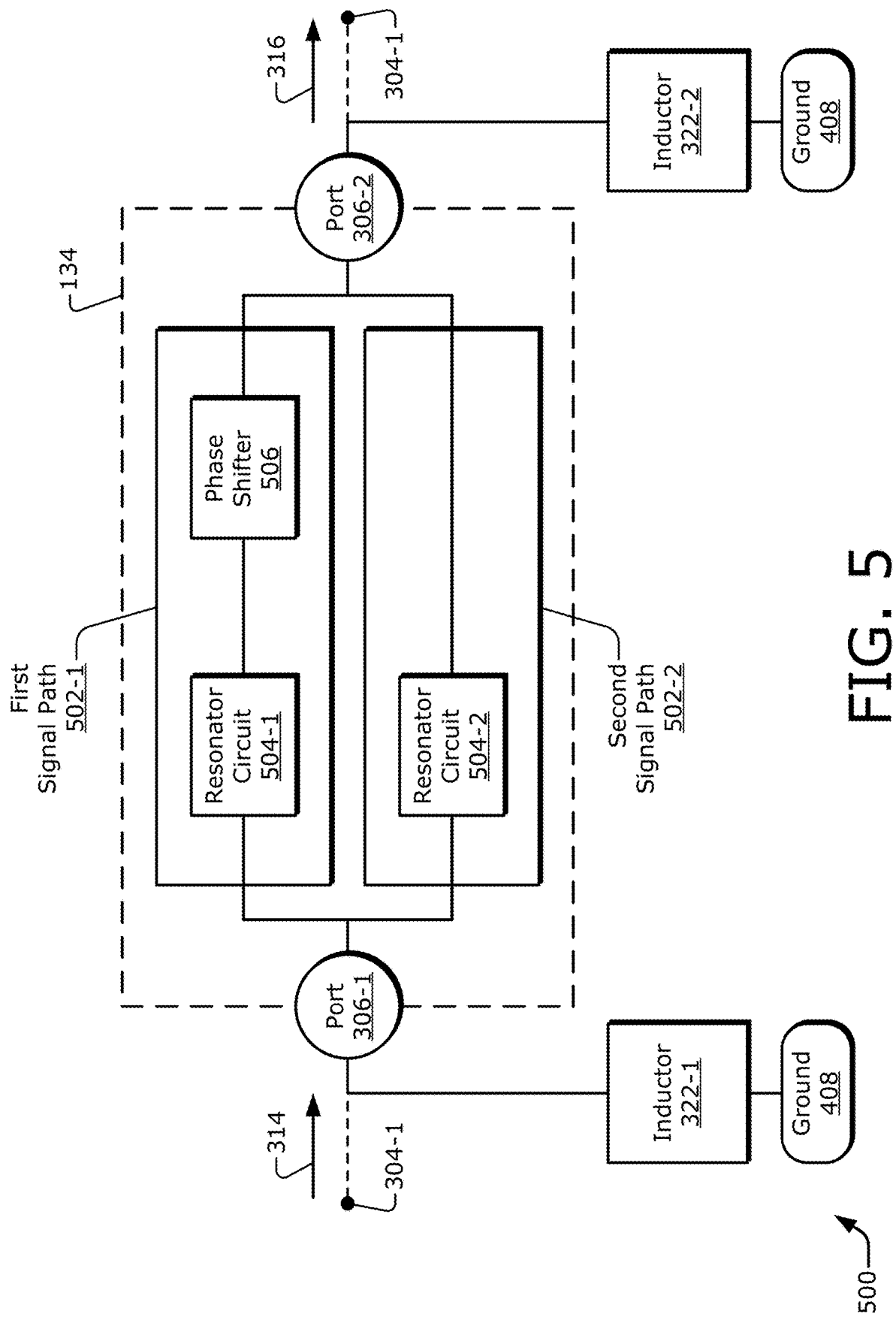
Figures 1, 5:
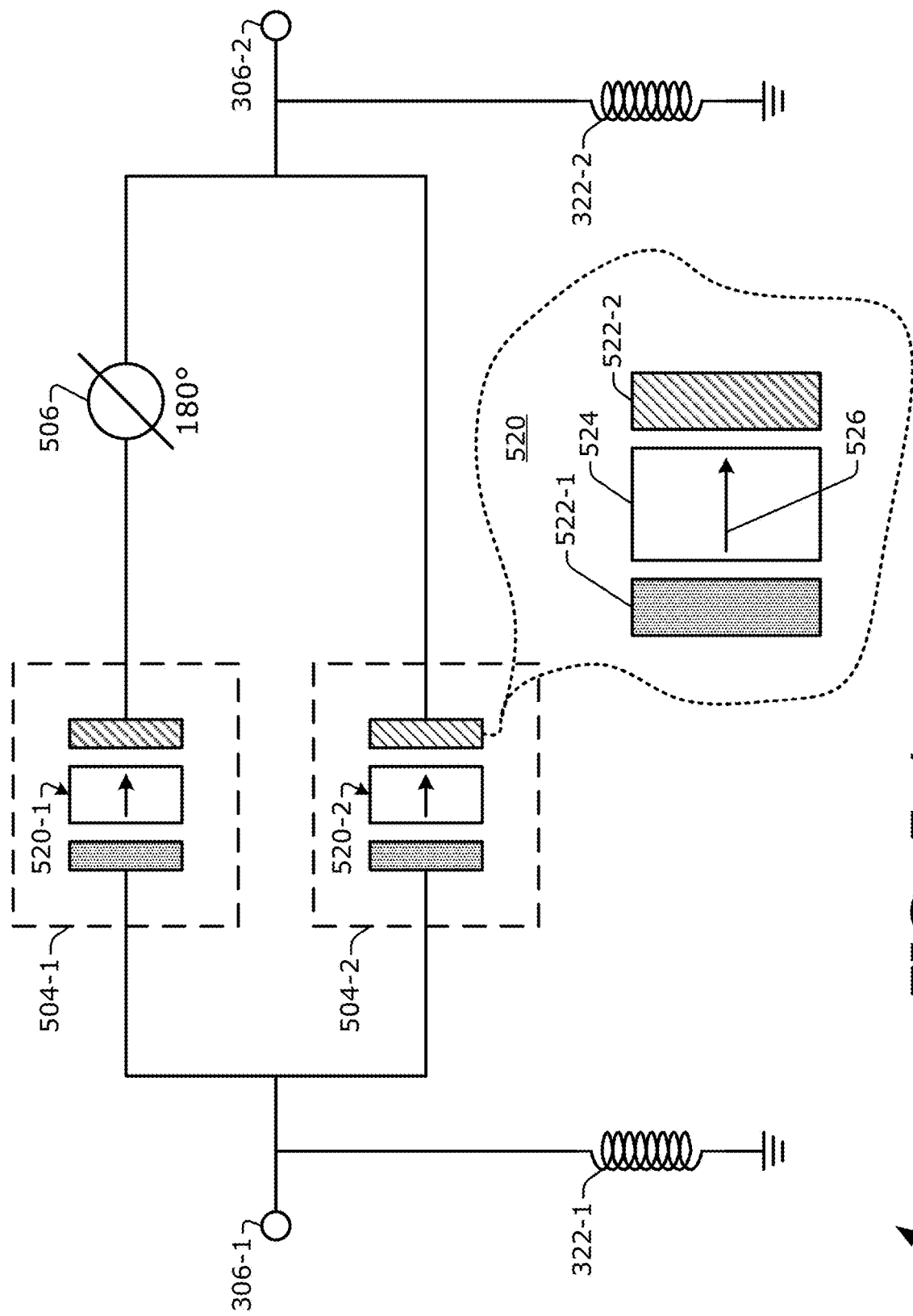
Figures 2, 5:
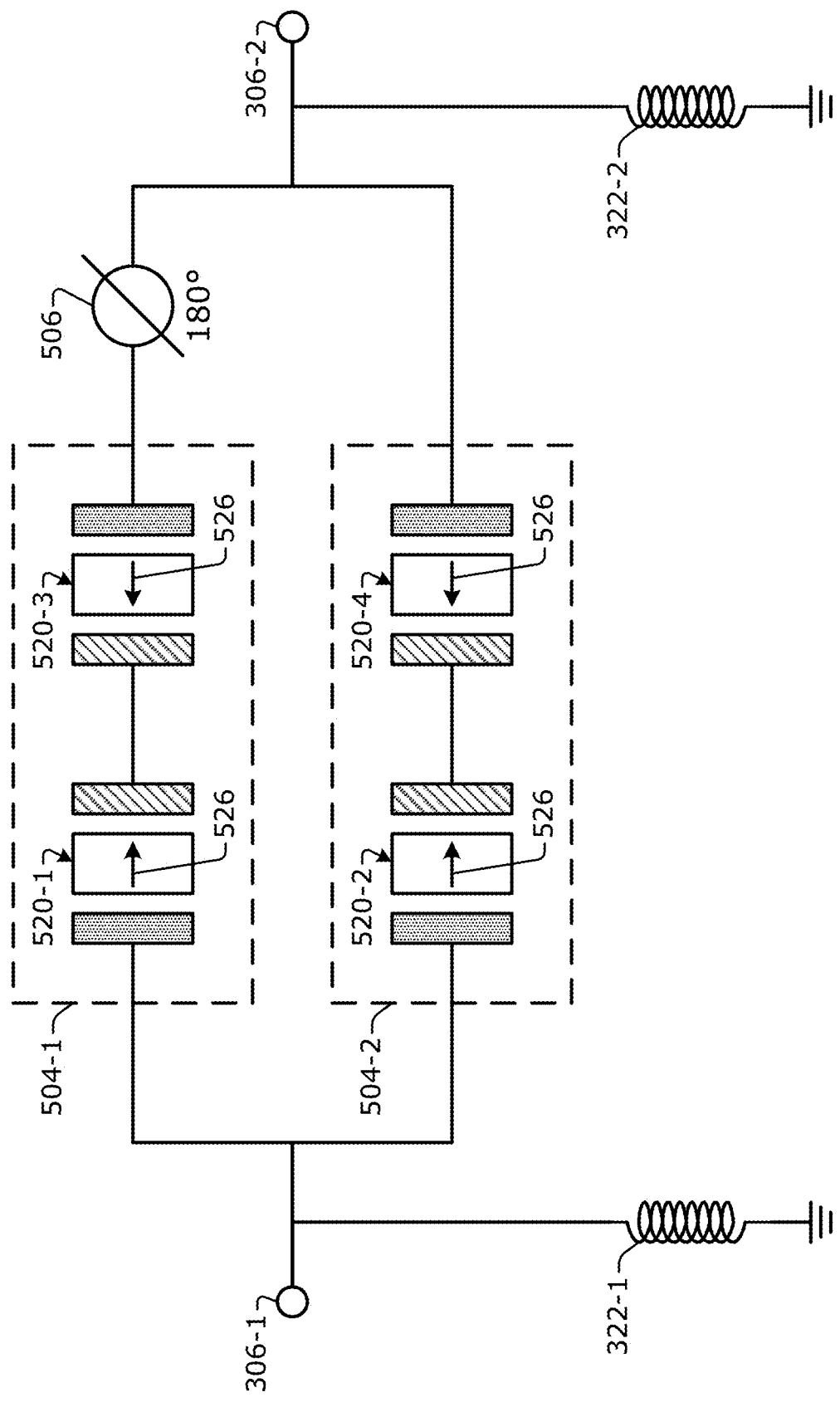
Figures 1, 6:
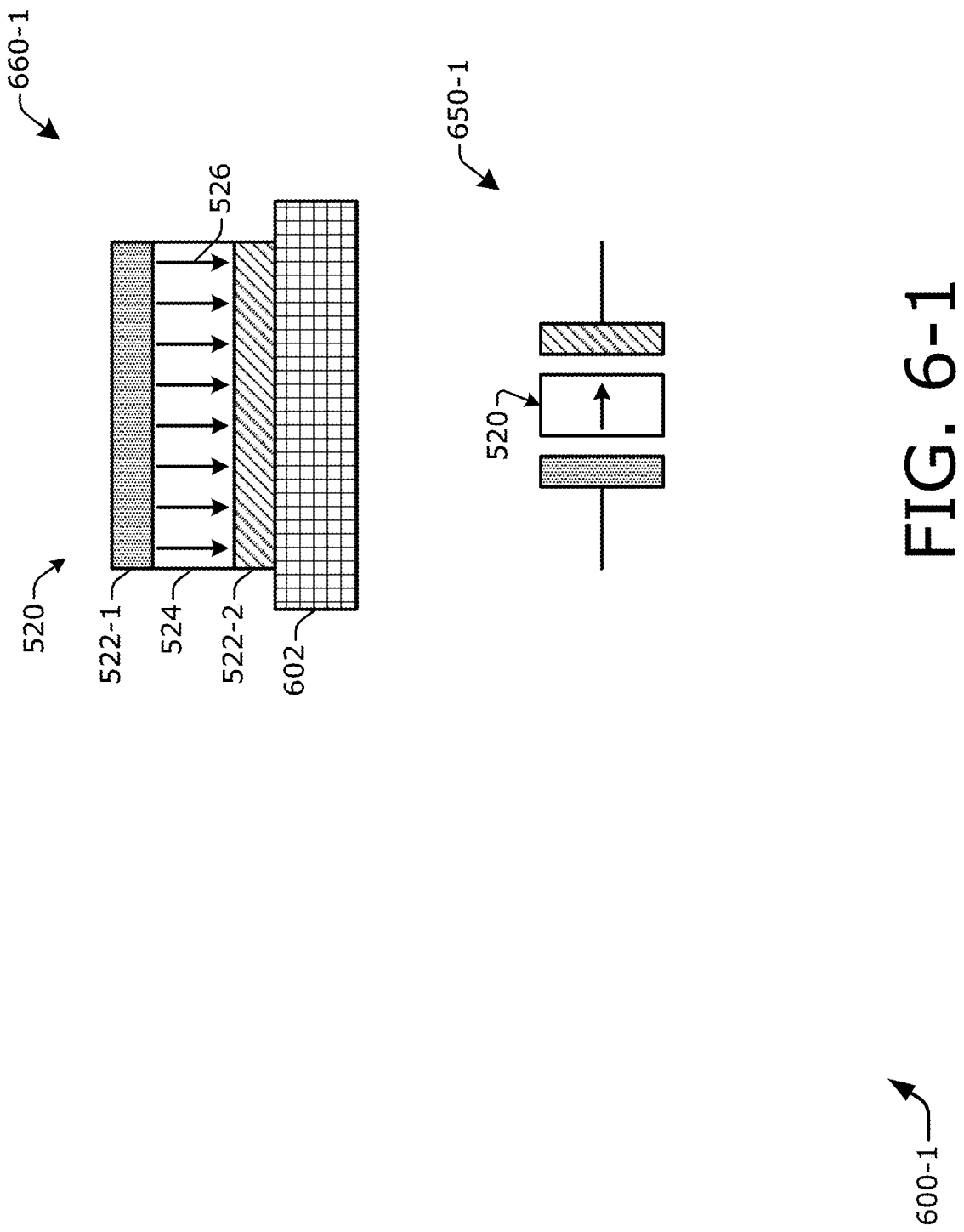
Figures 2, 6:
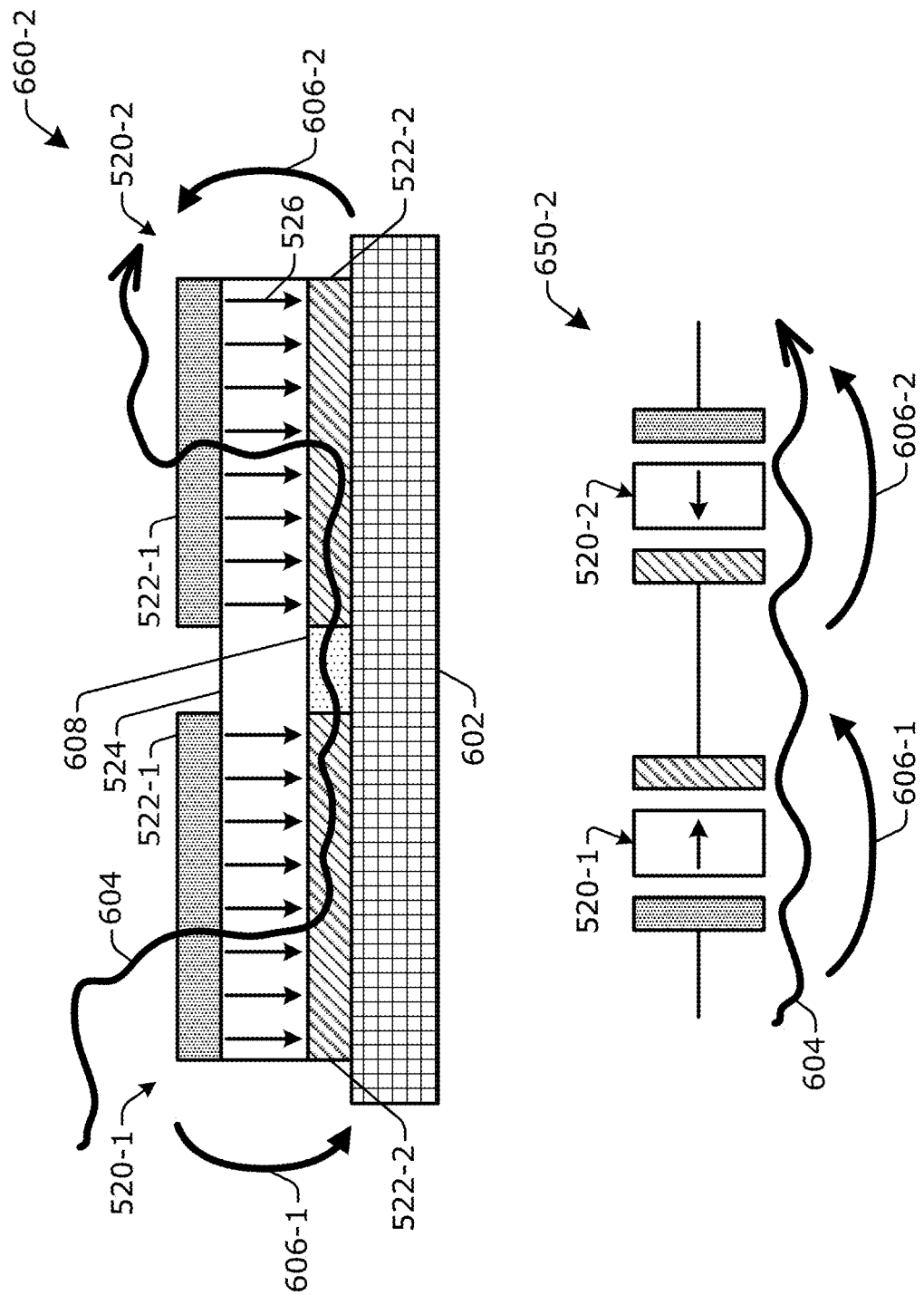
Figures 3, 6:
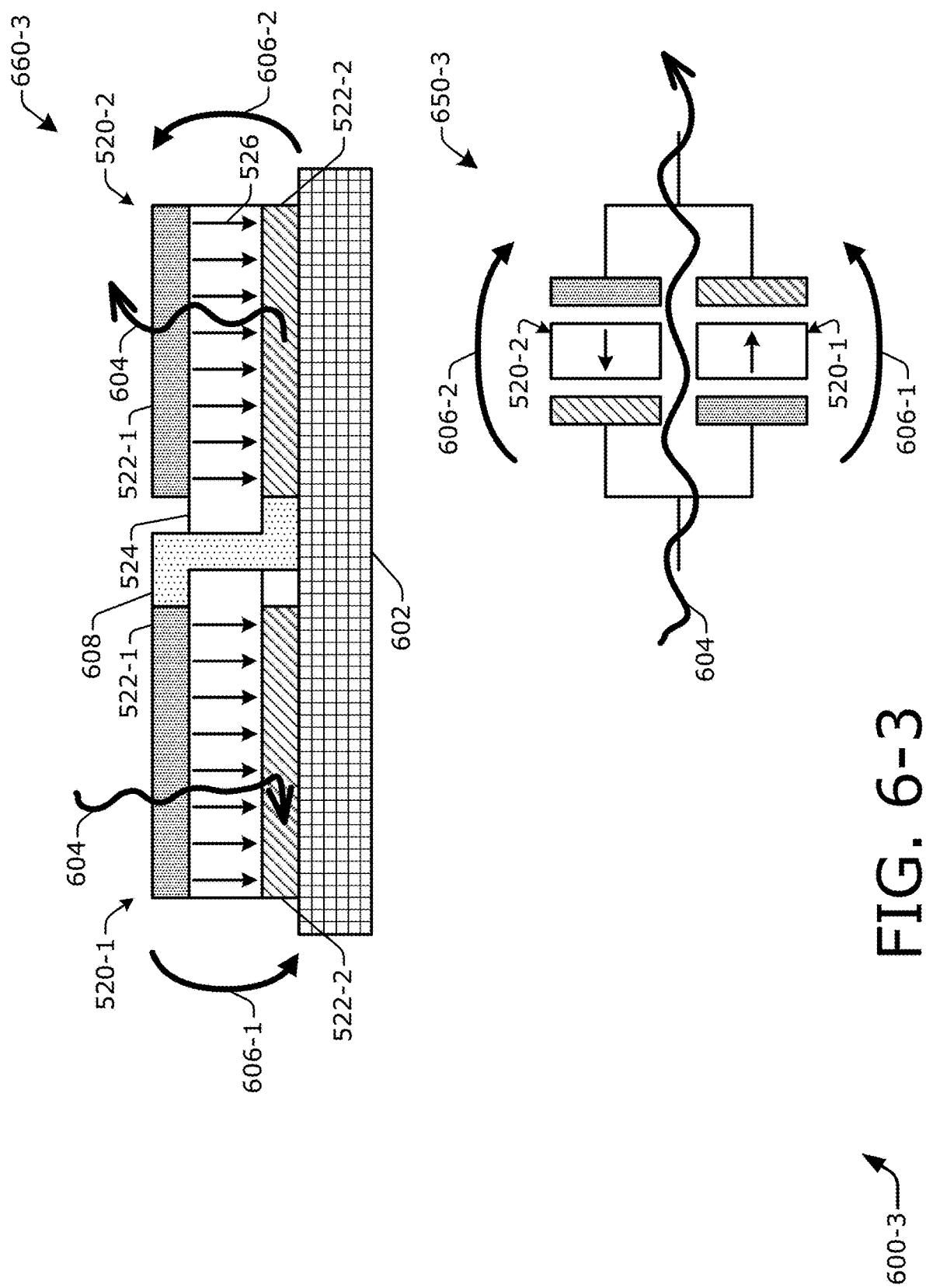

Acoustic resonators can be fabricated in multiple different manners. Example types of acoustic resonators include a bulk acoustic wave (BAW) resonator, a surface acoustic wave (SAW) resonator, a film bulk acoustic resonator (FBAR), a thin-film bulk acoustic resonator (TFBAR), and so forth. FIGS. 6-1 to 6-3 are described primarily in terms of BAW resonators. With reference to FIGS. 5-2 and 5-3, the first acoustic resonator 520-1 can be realized using a first bulk acoustic wave (BAW) resonator of the first resonator circuit 504-1 of the first signal path 502-1. The second acoustic resonator 520-3 can comprise a second BAW resonator of the first resonator circuit 504-1 of the first signal path 502-1. However, the described principles and operations are analogous to other types of acoustic resonators, such as SAW resonators.

FIG. 6-1 depicts, at 600-1 generally, examples of a cross-section view 660-1 and a circuit view 650-1 of a bulk acoustic wave (BAW) resonator. In other words, each acoustic resonator 520 may be implemented as a BAW resonator. The cross-section view 660-1 of a three-dimensional fabricated BAW resonator includes a substrate 602, which may include an acoustic mirror or other resonator-related structures. The cross-section view 660-1 also illustrates a first electrode 522-1, a second electrode 522-2, and at least one piezoelectric material 524. A crystal axis 526 is shown directed from the first electrode 522-1 to the second electrode 522-2. The crystal axis 526, however, can be directed from the second electrode 522-2 to the first electrode 522-1.

FIG. 6-2 depicts, at 600-2 generally, examples of a cross-section view 660-2 and a circuit view 650-2 of two anti-series-connected BAW resonators, including a first acoustic resonator 520-1 and a second acoustic resonator 520-2. In this example, as shown in the cross-section view 660-2, the two acoustic resonators can be built using a common substrate and at least one piezoelectric material 524. In this case, the two acoustic resonators may "share" a same piezoelectric material 524. Each respective acoustic resonator 520 also includes a respective first electrode 522-1 and a respective second electrode 522-2.

In example implementations, for both the first and second acoustic resonators 520-1 and 520-2, the crystal axis 526 points from the first electrode 522-1 to the second electrode 522-2. The two acoustic resonators are coupled together in series with the second electrode 522-2 of each being coupled together by a conductive material 608 to form a common node. At least one current 604 and at least one voltage 606 are shown for the two acoustic resonators. The current 604 can flow through the first and second acoustic resonators 520-1 and 520-2. A first voltage 606-1 is across the first acoustic resonator 520-1, and a second voltage 606-2 extends across the second acoustic resonator 520-2.

As shown, the current 604 flows with the direction of the crystal axis 526 of the first acoustic resonator 520-1 and against the direction of the crystal axis 526 for the second acoustic resonator 520-2. The first voltage 606-1 has a polarity or direction that matches the direction of the crystal axis 526 for the first acoustic resonator 520-1. In contrast, the second voltage 606-2 has a polarity or direction that is opposite that of the crystal axis 526 of the second acoustic resonator 520-2.

These example voltages and currents relative to the two crystal axes correspond to an anti-series connection for the two acoustic resonators. Due to the arrangement of the respective crystal orientations of the two acoustic resonators, and the current and voltages that are applied to the two acoustic resonators to establish the virtual inverted relative alignment, the virtually inverted crystal axes can cause the first acoustic resonator 520-1 to expand while the second acoustic resonator 520-2 contracts, and vice versa. This opposite expansion and contraction can operate to substantially cancel the second harmonic that is produced by the filtration performed by the first and second acoustic resonators 520-1 and 520-2.

FIG. 6-3 depicts, at 600-3 generally, examples of a cross-section view 660-3 and a circuit view 650-3 of two anti-parallel-connected BAW resonators. In example implementation for anti-parallel connections, a conductive material 608 couples the first electrode 522-1 of one acoustic resonator to the second electrode 522-2 of another acoustic resonator. Although not shown in the cross-section view 660-3, the second electrode 522-2 of the one acoustic resonator is coupled to the first electrode 522-1 of the other acoustic resonator. As described next, the resulting one or more currents and one or more voltages are analogous to those of the anti-series connected acoustic resonators.

The at least one current 604, which splits to propagate partly through both acoustic resonators individually, flows with the direction of the crystal axis 526 for the first acoustic resonator 520-1 but against the direction of the crystal axis 526 for the second acoustic resonator 520-2. The first voltage 606-1 has a polarity or direction that matches the direction of the crystal axis 526 for the first acoustic resonator 520-1. In contrast, the second voltage 606-2 has a polarity or direction that is opposite that of the crystal axis 526 of the second acoustic resonator 520-2. Accordingly, the resulting opposite expansion and contraction movements can operate to at least appreciably reduce the second harmonic that is produced by the filtration performed by the first and second acoustic resonators 520-1 and 520-2.

As shown in FIGS. 6-2 and 6-3, two or more acoustic resonators may "share" a same piezoelectric material 524. Thus, from a structural perspective, the piezoelectric material 524 may have a common crystal axis 526 across the multiple resonators. A respective crystal axis 526 for each respective acoustic resonator 520 may, however, be virtually inverted from a functional or operational perspective based on an applied voltage or current. At a given time, at least one current 604 that propagates through the acoustic resonators can be in a direction of the crystal axis for one acoustic resonator and against a direction of the crystal axis for another acoustic resonator. Analogously, at a given time, at least one voltage 606 that is applied across the acoustic resonators can be in a direction of the crystal axis for one acoustic resonator and against a direction of the crystal axis for another acoustic resonator. In these manners, one crystal axis can be virtually (e.g., operationally based on an applied current or voltage) inverted relative to another crystal axis of two or more acoustic resonators at any given time as an alternating current (AC) signal is applied to the multiple acoustic resonators.

The three cross-section views 660-1, 660-2, and 660-3 are illustrated in terms of BAW filters. The three corresponding respective circuit views 650-1, 650-2, and 650-3, however, are equally applicable to SAW filters. Further, the operations of the currents and voltages are analogous and comparable. In other words, SAW acoustic resonators that are anti-series or anti-parallel connected may likewise at least reduce a second-order harmonic signal that is generated as the SAW acoustic resonators filter a signal propagating through the SAW acoustic-resonator-based filters. Lattice filters, including half lattice filters, can therefore be constructed using BAW acoustic resonators, SAW acoustic resonators, and so forth.

In example implementations for a lattice filter 134, a first acoustic resonator 520-1 includes a piezoelectric material 524 having a crystal axis 526. A second acoustic resonator 520-3 (e.g., of FIG. 5-2 or 5-3) includes a piezoelectric material 524 having a crystal axis 526. The piezoelectric material 524 may be the same material, a continuation of the same material, or a different material. In some cases, the lattice filter 134 can propagate at least a portion of a current 604 in a direction of the crystal axis 526 of the first acoustic resonator 520-1 and propagate the at least a portion of the current 604 against a direction of the crystal axis 526 of the second acoustic resonator 520-3 (or second acoustic resonator 520-2 as depicted in FIGS. 6-2 and 6-3). The two acoustic resonators may be connected in an anti-series or an anti-parallel arrangement for these example current scenarios. In the same or different cases, the lattice filter 134 can be configured to apply at least one voltage 606-1/606-2 across the first acoustic resonator 520-1 and the second acoustic resonator 520-3 in a direction of the crystal axis 526 of the first acoustic resonator 520-1 and against a direction of the crystal axis 526 of the second acoustic resonator 520-3 (or second acoustic resonator 520-2 as depicted in FIGS. 6-2 and 6-3). The two acoustic resonators may be connected in an anti-series or an anti-parallel arrangement for these example voltage scenarios.

Figure 7:
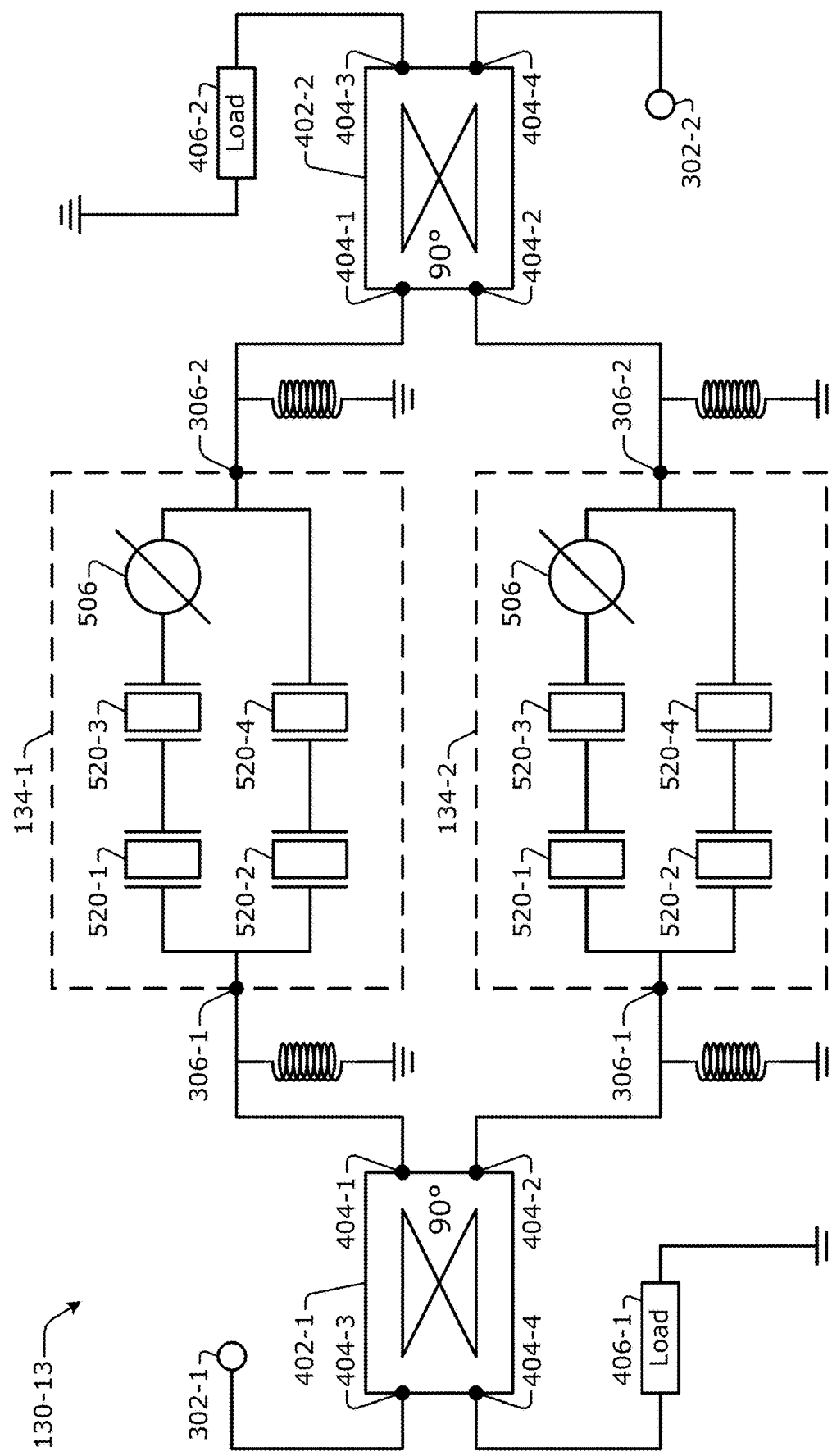
FIG. 7 is a circuit diagram illustrating an example filter circuit providing harmonic reduction using hybrid couplers and dual half lattice filters that employ acoustic resonators, which can have virtually inverted crystal axis orientations.

FIG. 7 is a circuit diagram 700 illustrating an example filter circuit 130-13 providing harmonic reduction using hybrid couplers and dual half lattice filters that employ acoustic resonators, which can have virtually inverted crystal axis orientations. The circuitry of FIG. 7 combines aspects of various example implementations as described herein to reduce third-order harmonics or to reduce second-order and third-order harmonics. The filter circuit 130-13 (e.g., a filter circuit 130 of FIGS. 1 to 3) of the circuit diagram 700 can correspond to the circuit diagram 400-1 of FIG. 4-2 with two 90° hybrid couplers. With the 90° hybrid couplers, the filter circuit 130-13 can appreciably reduce third-order harmonics.

Each of the lattice filters 134-1 and 134-2 can be architected to at least appreciably reduce second-order harmonics. For example, the four serially coupled pairs of acoustic resonators can be connected in an "anti-serial" arrangement. For instance, the acoustic resonators 520-1 and 520-3 can be coupled together in series with virtually inverted crystal axes relative to each other. Further, the acoustic resonators 520-2 and 520-4 can also be coupled together in series with virtually inverted crystal axes relative to each other. Generally, each pair of the four depicted pairs of series-coupled acoustic resonators can be coupled in anti-series to reduce the second-order harmonic of signals that are filtered by the two lattice filters 134-1 and 134-2.

The two hybrid couplers may be sufficiently wideband to provide the 90° phase shift at the fundamental frequency and at the third harmonic frequency. The filter circuit 130-13 may be implemented in alternative manners. For example, each of the hybrid couplers can be replaced with a power divider or combiner and at least one phase shifter (e.g., to produce a 90° phase difference), as shown in FIG. 4-2. Instead of 90° hybrid couplers, the filter circuit 130-13 can include 180° hybrid couplers (or phase shifters that introduce a 180° phase difference) to appreciably reduce second-order harmonics. Further, if a wider bandwidth is not desired, the four illustrated inductors may be omitted.

Additionally or alternatively, the circuitry for each lattice filter 134 may be changed. As one example, the four pairs of coupled acoustic filters may be coupled together in anti-parallel form, as shown in FIGS. 5-3 and 6-3. As another example, another type of half lattice filter (e.g., any of those described above with reference to FIGS. 3-2 to 3-6) may be employed to realize each lattice filter 134. As yet another example, the full lattice filter of FIG. 3-1 may be used in one or more of the lattice filters 134-1 and 134-2. The full lattice filter of FIG. 3-1 can also appreciably reduce the second-order harmonic. This example is described with reference to FIG. 8.

Figure 8:
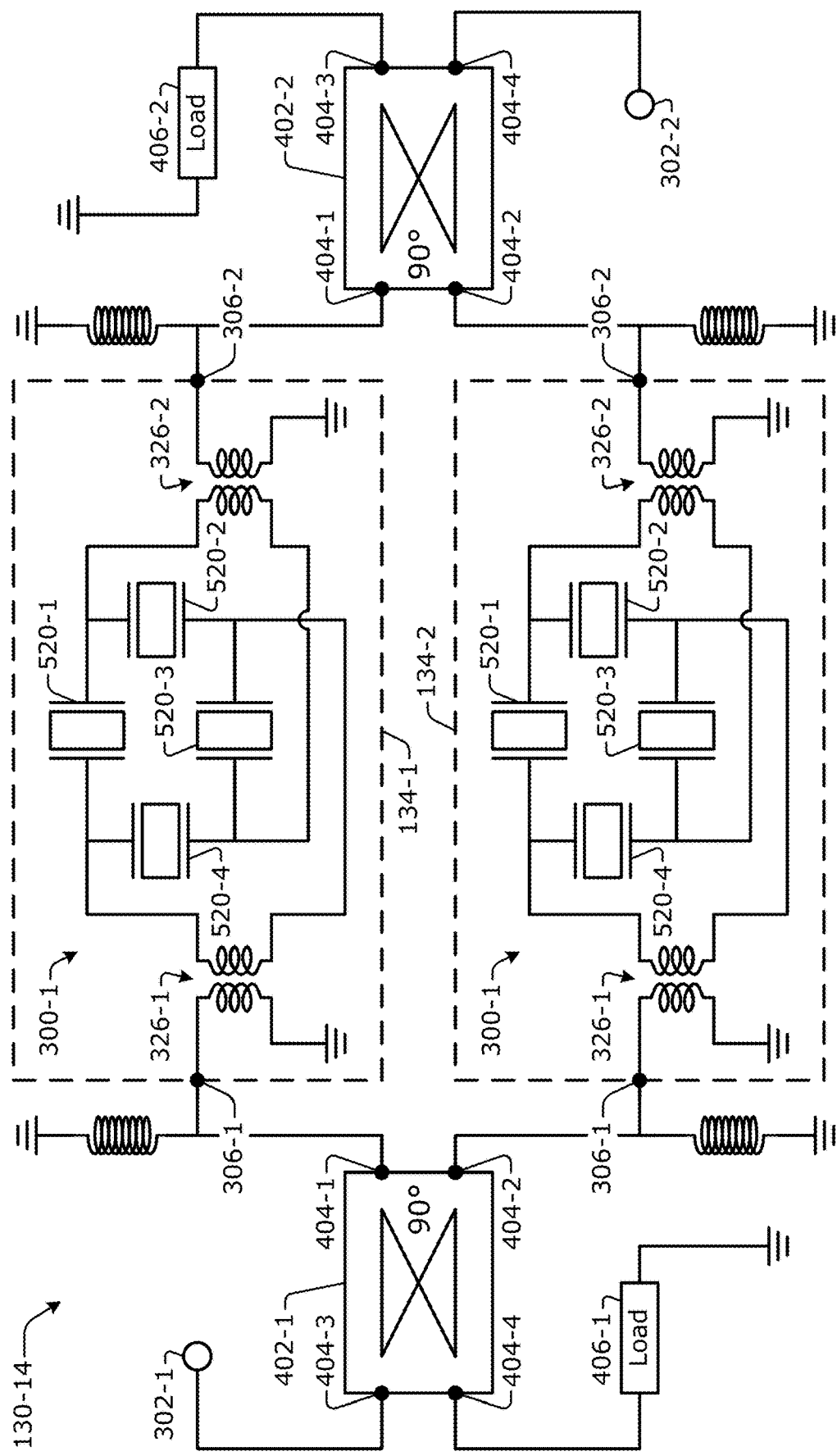
FIG. 8 is a circuit diagram illustrating an example filter circuit providing harmonic reduction using hybrid couplers and dual full lattice filters that employ acoustic resonators and transformers.

FIG. 8 is a circuit diagram 800 illustrating an example filter circuit 130-14 providing harmonic reduction using hybrid couplers and dual full lattice filters that employ acoustic resonators and transformers. Example implementations of a full lattice filter 300-1 are described above with reference to FIG. 3-1. Each full lattice filter 300-1 can include four acoustic resonators 520-1 to 520-4 and two transformers 326-1 and 326-2. The full lattice filter 300-1 as depicted can at least appreciably reduce the second-order harmonic without using anti-serial or anti-parallel connections for the acoustic resonators.

Thus, the filter circuit 130-14, like the filter circuit 130-13 of FIG. 7, can reduce second-order harmonics and third-order harmonics with the combination of the full lattice filter architecture and the dual 90° hybrid coupler scheme. The filter circuit 130-14 of FIG. 8 can be realized in the alternative configurations that are described above with reference to the filter circuit 130-13 of FIG. 7. For example, the inductors may be omitted, or the 90° hybrid couplers may be replaced with 180° hybrid couplers. Further, each of the 90° hybrid couplers may be substituted with a power divider or combiner and at least one phase shifter (e.g., to produce or remove a 90° phase difference between two signals) as described above with reference to FIG. 4-2. This substitution can maintain the ability of the first and second signal manipulator circuits 132-1 and 132-2 (e.g., of FIGS. 1, 3, 4-1, 4-2, and 9) to appreciably reduce the third-order harmonic. These alternatives are depicted in FIG. 9.

Figure 9:
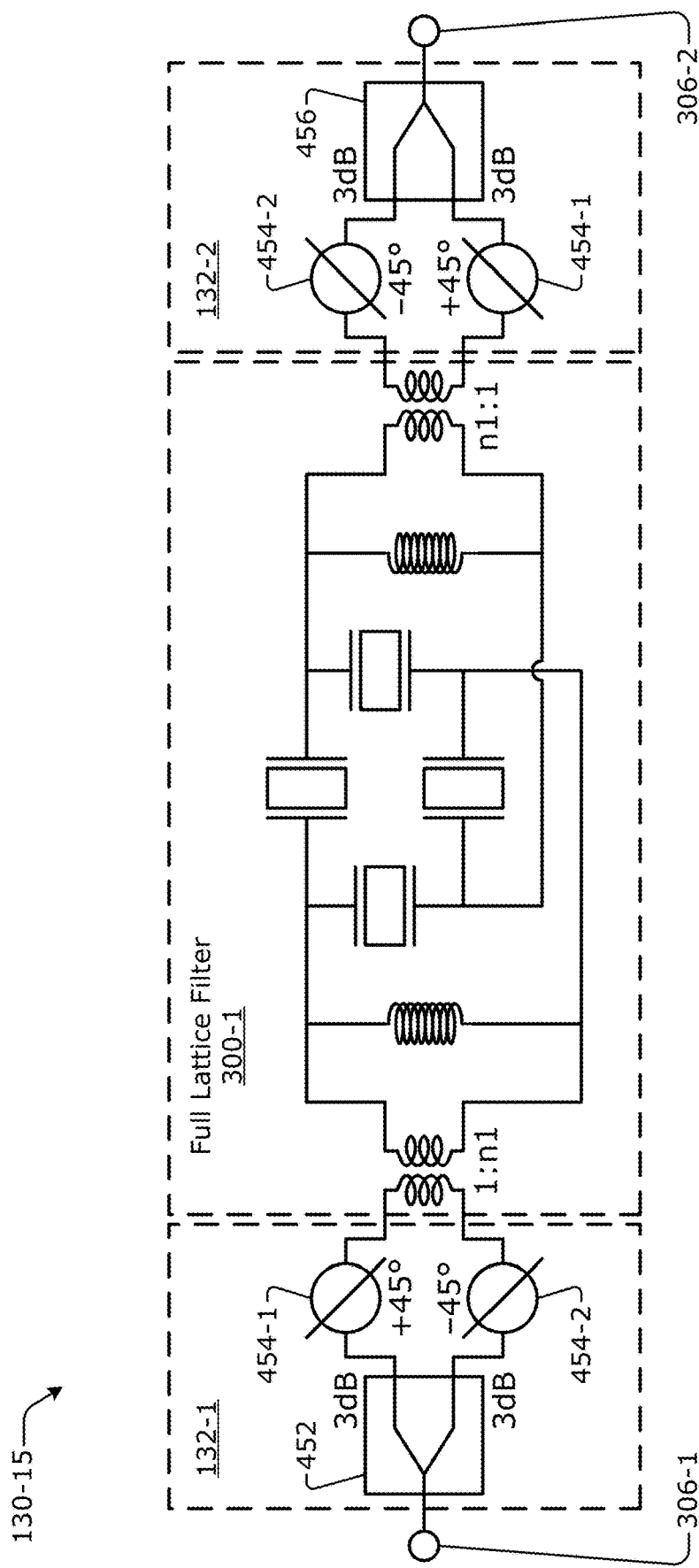
FIG. 9 is a circuit diagram illustrating an example filter circuit providing harmonic reduction using power divider/combiners and phase shifters in conjunction with a full bridge filter that employs acoustic resonators.

FIG. 9 is a circuit diagram 900 illustrating an example filter circuit 130-15 providing harmonic reduction using power divider/combiners and phase shifters in conjunction with a full bridge filter 300-1 that employs acoustic resonators. The full lattice filter 300-1, which is described above with reference to FIG. 3-1, can at least reduce the second-order harmonic of a signal being filtered, even without employing virtually inverted crystal axes for the acoustic resonators. The first signal manipulator circuit 132-1 and the second signal manipulator circuit 132-2 correspond to example implementations like those described above with reference to FIG. 4-2. The first and second signal manipulator circuits 132-1 and 132-2 can jointly reduce the third-order harmonic of the signal being filtered using the power divider 452, the power combiner 456, and the four phase shifters 454-1 and 454-2 (two of each pair). Here, the phase shifters 454-1 and 454-2 shift a phase of a respective split signal by +45° or −45°.

Figure 10:
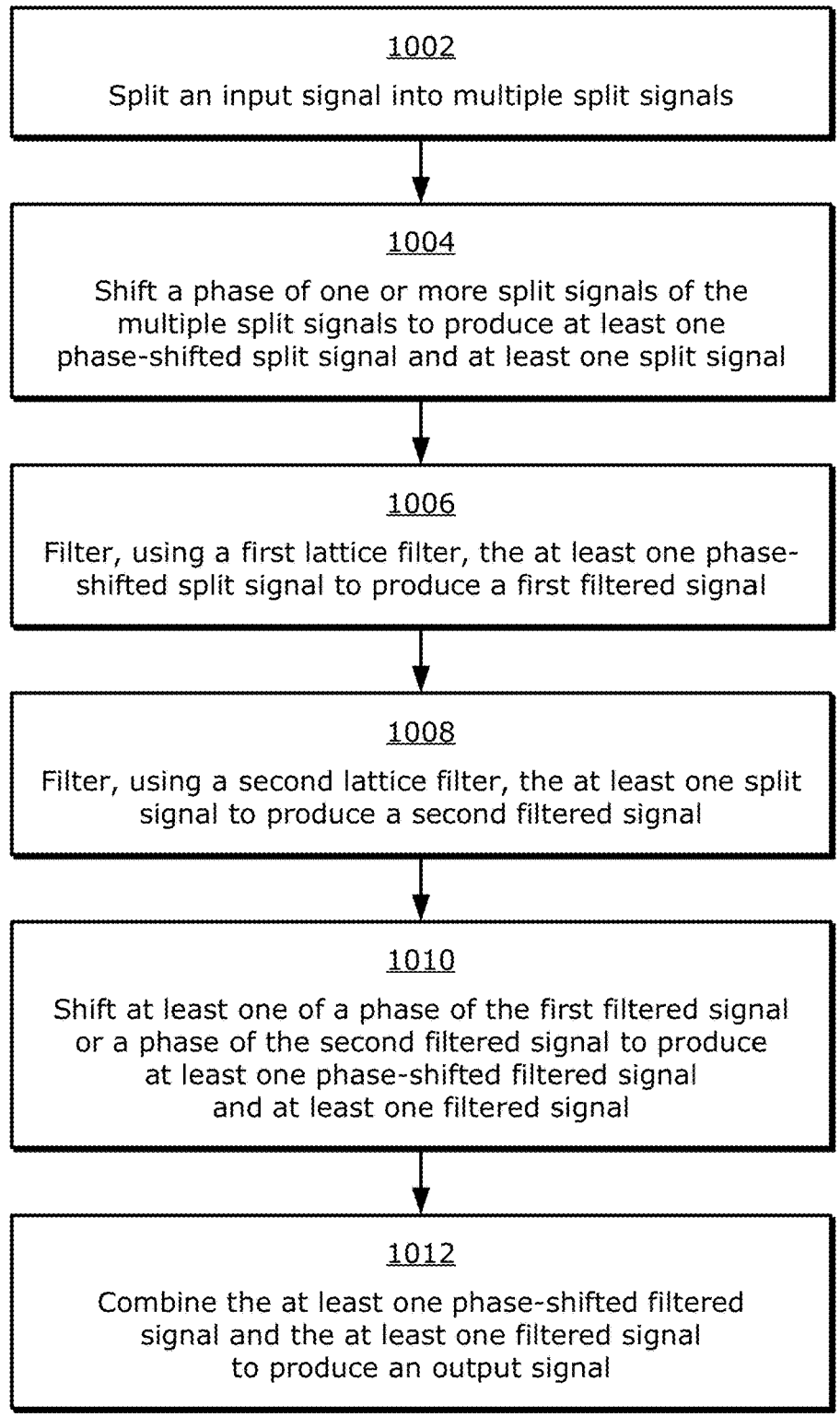
FIG. 10 is a flow diagram illustrating an example process for harmonic reduction with filtering.

FIG. 10 is a flow diagram illustrating an example process for harmonic reduction with filtering. The process 1000 is described in the form of a set of blocks 1002-1012 that specify operations that can be performed. However, operations are not necessarily limited to the order shown in FIG. 10 or described herein, for the operations may be implemented in alternative orders or in fully or partially overlapping manners. Also, more, fewer, and/or different operations may be implemented to perform the process 1000 or an alternative process. Operations represented by the illustrated blocks of the process 1000 may be performed by an electronic device, such as the electronic device 102 of FIG. 1 or the wireless interface device 120 thereof. More specifically, the operations of the process 1000 may be performed by a filter circuit 130 of a transceiver 126 or an RF front-end 128.

At block 1002, a filter circuit 130 splits an input signal into multiple split signals. For example, a first signal manipulator circuit 132-1 can split an input signal 310 into multiple split signals. The first signal manipulator circuit 132-1 may use, for instance, a hybrid coupler 402 or a power divider 452. At block 1004, the filter circuit 130 shifts a phase of one or more split signals of the multiple split signals to produce at least one phase-shifted split signal and at least one split signal. For example, the first signal manipulator circuit 132-1 can shift a phase of one or more split signals of the multiple split signals to produce at least one phase-shifted split signal and at least one split signal.

At block 1006, the filter circuit 130 filters, using a first lattice filter, the at least one phase-shifted split signal to produce a first filtered signal. For example, a first lattice filter 134-1 can filter the at least one phase-shifted split signal to produce a first filtered signal. At block 1008, the filter circuit 130 filters, using a second lattice filter, the at least one split signal to produce a second filtered signal. For example, a second lattice filter 134-2 can filter the at least one split signal to produce a second filtered signal. The at least one split signal may also be phase-shifted, such as if the first signal manipulator circuit 132-1 shifts two split signals by approximately equal amounts but in different directions (e.g., by +/−45°).

At block 1010, the filter circuit 130 shifts at least one of a phase of the first filtered signal or a phase of the second filtered signal to produce at least one phase-shifted filtered signal and at least one filtered signal. For example, a second signal manipulator circuit 132-2 can shift at least one of a phase of the first filtered signal or a phase of the second filtered signal of multiple filtered signals 316 to produce at least one phase-shifted filtered signal and at least one filtered signal. The at least one filtered signal may also be phase-shifted, such as if the second signal manipulator circuit 132-2 shifts two filtered signals by approximately equal amounts but in different directions (e.g., by −/+45°).

At block 1012, the filter circuit 130 combines the at least one phase-shifted filtered signal and the at least one filtered signal to produce an output signal. For example, the second signal manipulator circuit 132-2 can merge the at least one phase-shifted filtered signal and the at least one filtered signal to produce an output signal 312. The second signal manipulator circuit 132-2 may use, for instance, a hybrid coupler 402 or a power combiner 456.

Some example aspects are described below.

Example aspect 1: An apparatus comprising:
a filter circuit comprising:
  a first filter port;
  a second filter port;
  a first signal manipulator circuit comprising a first port, a second port, and a third port coupled to the first filter port, the first signal manipulator circuit configured to:
    split an input signal into multiple split signals;
    shift a phase of one or more split signals of the multiple split signals to produce at least one phase-shifted split signal and at least one split signal; and
    provide the at least one phase-shifted split signal and the at least one split signal to the first port and the second port;
  a first lattice filter coupled to the first port of the first signal manipulator circuit;
  a second lattice filter coupled to the second port of the first signal manipulator circuit; and
  a second signal manipulator circuit comprising a first port coupled to the first lattice filter, a second port coupled to the second lattice filter, and a third port coupled to the second filter port, the second signal manipulator circuit configured to:
    accept multiple filtered signals from the first lattice filter and the second lattice filter;
    shift a phase of one or more filtered signals of the multiple filtered signals to produce at least one phase-shifted filtered signal and at least one filtered signal; and
    combine the at least one phase-shifted filtered signal and the at least one filtered signal into an output signal at the third port of the second signal manipulator circuit.

Example aspect 2: The apparatus of example aspect 1, wherein:
the first signal manipulator circuit comprises a hybrid coupler comprising a first hybrid port, a second hybrid port, and a third hybrid port;
the first hybrid port of the hybrid coupler is coupled to the first port of the first signal manipulator circuit;
the second hybrid port of the hybrid coupler is coupled to the second port of the first signal manipulator circuit; and
the third hybrid port of the hybrid coupler is coupled to the third port of the first signal manipulator circuit.

Example aspect 3: The apparatus of example aspect 2, wherein:
the hybrid coupler comprises a fourth hybrid port; and
the filter circuit comprises at least one load component coupled between the fourth hybrid port and a ground.

Example aspect 4: The apparatus of example aspect 2 or example aspect 3, wherein:
the hybrid coupler comprises a ninety-degree (90°) hybrid coupler.

Example aspect 5: The apparatus of any one of example aspects 2-4, wherein:
the hybrid coupler is configured to output the at least one phase-shifted split signal and the at least one split signal, the at least one phase-shifted split signal and the at least one split signal having respective phases that are approximately ninety degrees (90°) apart from each other.

Example aspect 6: The apparatus of any one of example aspects 2-5, wherein:
the hybrid coupler of the first signal manipulator circuit comprises a first hybrid coupler;
the second signal manipulator circuit comprises a second hybrid coupler comprising a first hybrid port, a second hybrid port, and a third hybrid port;
the first hybrid port of the second hybrid coupler is coupled to the first port of the second signal manipulator circuit;
the second hybrid port of the second hybrid coupler is coupled to the second port of the second signal manipulator circuit; and
the third hybrid port of the second hybrid coupler is coupled to the third port of the second signal manipulator circuit.

Example aspect 7: The apparatus of example aspect 6, wherein:
the first hybrid coupler comprises a first ninety-degree (90°) hybrid coupler; and
the second hybrid coupler comprises a second ninety-degree (90°) hybrid coupler.

Example aspect 8: The apparatus of any one of the preceding example aspects, wherein the first signal manipulator circuit comprises:
a power divider comprising an input node, a first output node, and a second output node, the input node coupled to the third port of the first signal manipulator circuit;
a first phase shifter coupled between the first output node and the first port of the first signal manipulator circuit; and
a second phase shifter coupled between the second output node and the second port of the first signal manipulator circuit.

Example aspect 9: The apparatus of example aspect 8, wherein:
the first phase shifter is configured to shift a phase of a first split signal of the multiple split signals by approximately positive forty-five degrees (+45°); and
the second phase shifter is configured to shift a phase of a second split signal of the multiple split signals by approximately negative forty-five degrees (−45°).

Example aspect 10: The apparatus of example aspect 8, wherein:
the first phase shifter is configured to shift a phase of a first split signal of the multiple split signals by approximately positive ninety degrees (+90°); and the second phase shifter is configured to shift a phase of a second split signal of the multiple split signals by approximately negative ninety degrees (−90°).

Example aspect 11: The apparatus of any one of example aspects 8-10, wherein the second signal manipulator circuit comprises:
a power combiner comprising a first input node, a second input node, and an output node, the output node coupled to the third port of the second signal manipulator circuit;
a first phase shifter coupled between the first port of the second signal manipulator circuit and the first input node; and
a second phase shifter coupled between the second port of the second signal manipulator circuit and the second input node.

Example aspect 12: The apparatus of any one of the preceding example aspects, wherein the first signal manipulator circuit and the second signal manipulator circuit are jointly configured to:
at least attenuate at the output signal a third-order harmonic that is generated based on the input signal by at least one of the first lattice filter or the second lattice filter.

Example aspect 13: The apparatus of any one of the preceding example aspects, wherein the first signal manipulator circuit and the second signal manipulator circuit are jointly configured to:
at least attenuate at the output signal a second-order harmonic that is generated based on the input signal by at least one of the first lattice filter or the second lattice filter.

Example aspect 14: The apparatus of any one of the preceding example aspects, wherein the filter circuit further comprises:
a first inductor coupled between a ground and the first port of the first signal manipulator circuit at a node located between the first signal manipulator circuit and the first lattice filter; and
a second inductor coupled between the ground and the first port of the second signal manipulator circuit at another node located between the second signal manipulator circuit and the first lattice filter.

Example aspect 15: The apparatus of any one of the preceding example aspects, wherein the first lattice filter comprises:
a first signal path coupled between the first port of the first signal manipulator circuit and the first port of the second signal manipulator circuit, the first signal path comprising a first resonator circuit; and
a second signal path coupled between the first port of the first signal manipulator circuit and the first port of the second signal manipulator circuit, the second signal path comprising a second resonator circuit.

Example aspect 16: The apparatus of example aspect 15, wherein:
the first signal path comprises a phase shifter; and
the first resonator circuit and the phase shifter are coupled together in series between the first port of the first signal manipulator circuit and the first port of the second signal manipulator circuit.

Example aspect 17: The apparatus of example aspect 15 or example aspect 16, wherein:
the first resonator circuit comprises at least one acoustic resonator; and
the second resonator circuit comprises at least one acoustic resonator.

Example aspect 18: The apparatus of example aspect 17, wherein the at least one acoustic resonator of the first resonator circuit comprises:
a first acoustic resonator; and
a second acoustic resonator coupled to the first acoustic resonator.

Example aspect 19: The apparatus of example aspect 18, wherein:
the first acoustic resonator and the second acoustic resonator are coupled together in anti-series between the first port of the first signal manipulator circuit and the first port of the second signal manipulator circuit.

Example aspect 20: The apparatus of example aspect 18, wherein:
the first acoustic resonator and the second acoustic resonator are coupled together in anti-parallel between the first port of the first signal manipulator circuit and the first port of the second signal manipulator circuit.

Example aspect 21: The apparatus of any one of example aspects 18-20, wherein:
the first acoustic resonator comprises at least one piezoelectric material having a crystal axis;
the second acoustic resonator comprises the at least one piezoelectric material having a crystal axis; and
the first and second acoustic resonators are electrically connected such that respective electric fields within the at least one piezoelectric material of the first and second acoustic resonators are opposite in phase with regard to the respective crystal axis of each acoustic resonator of the first and second acoustic resonators.

Example aspect 22: The apparatus of any one of example aspects 18-21, wherein:
the first acoustic resonator comprises a first bulk acoustic wave (BAW) resonator of the first resonator circuit of the first signal path; and
the second acoustic resonator comprises a second BAW resonator of the first resonator circuit of the first signal path.

Example aspect 23: The apparatus of any one of example aspects 18-22, wherein:
a resonance frequency of the first acoustic resonator is substantially equal to a resonance frequency of the second acoustic resonator; and
a static capacitance of the first acoustic resonator is substantially equal to a static capacitance of the second acoustic resonator.

Example aspect 24: The apparatus of any one of example aspects 18-23, wherein the first acoustic resonator and the second acoustic resonator are jointly configured to:
at least attenuate a second-order harmonic that is generated by the first acoustic resonator individually and the second acoustic resonator individually.

Example aspect 25: The apparatus of any one of example aspects 18, 19, or 21-24, wherein:
the first acoustic resonator comprises:
a first electrode;
a second electrode; and
a piezoelectric material coupled to the first electrode and the second electrode, the piezoelectric material having a crystal axis that is directed from the first electrode to the second electrode;
the second acoustic resonator comprises:
a first electrode;
a second electrode; and
a piezoelectric material coupled to the first electrode and the second electrode of the second acoustic resonator, the piezoelectric material having a crystal axis that is directed from the first electrode to the second electrode of the second acoustic resonator;

the first acoustic resonator is coupled in series with the second acoustic resonator; and the second electrode of the first acoustic resonator is coupled to the second electrode of the second acoustic resonator.

Example aspect 26: The apparatus of any one of example aspects 18-25, wherein:

the first acoustic resonator comprises a piezoelectric material having a crystal axis;

the second acoustic resonator comprises a piezoelectric material having a crystal axis; and the first lattice filter is configured to:

propagate at least a portion of at least one current in a direction of the crystal axis of the first acoustic resonator at a given time; and propagate the at least a portion of the at least one current against a direction of the crystal axis of the second acoustic resonator at the given time.

Example aspect 27: The apparatus of any one of example aspects 18-26, wherein:

the first acoustic resonator comprises a piezoelectric material having a crystal axis;

the second acoustic resonator comprises a piezoelectric material having a crystal axis; and the first lattice filter is configured to:

apply at least one voltage across the first acoustic resonator and the second acoustic resonator in a direction of the crystal axis of the first acoustic resonator at a given time and against a direction of the crystal axis of the second acoustic resonator at the given time.

Example aspect 28: The apparatus of any one of example aspects 1-14, wherein:

the first lattice filter comprises a first full lattice filter; and the second lattice filter comprises a second full lattice filter.

Example aspect 29: The apparatus of any one of the preceding example aspects, further comprising:

a radio-frequency front-end comprising the filter circuit.

Example aspect 30: The apparatus of example aspect 29, further comprising:

a wireless interface device comprising the radio-frequency front-end;

a display screen; and at least one processor operatively coupled to the display screen and at least a portion of the wireless interface device, the at least one processor configured to present one or more graphical images on the display screen based on one or more wireless signals communicated using the filter circuit of the wireless interface device.

Example aspect 31: An apparatus for filtering a signal, the apparatus comprising:

means for manipulating an input signal to produce multiple manipulated signals including at least one phase-shifted manipulated signal;

first means for filtering the at least one phase-shifted manipulated signal of the multiple manipulated signals to produce a first filtered signal;

second means for filtering at least one manipulated signal of the multiple manipulated signals to produce a second filtered signal; and means for manipulating the first filtered signal and the second filtered signal to produce an output signal having a reduced third-order harmonic relative to third-order harmonics generated by the first means and the second means.

Example aspect 32: The apparatus of example aspect 31, wherein the means for manipulating an input signal to produce multiple manipulated signals comprises:

means for coupling a portion of the input signal to the first means as the at least one phase-shifted manipulated signal and another portion of the input signal to the second means as the at least one manipulated signal, the at least one phase-shifted manipulated signal having a phase that is shifted at least relative to the at least one manipulated signal.

Example aspect 33: The apparatus of example aspect 31 or example aspect 32, wherein the first means for filtering comprises:

means for canceling a second-order harmonic using multiple acoustic resonators having crystal axes that are virtually inverted relative to each other.

Example aspect 34: A method for filtering a signal, the method comprising:

splitting an input signal into multiple split signals;

shifting a phase of one or more split signals of the multiple split signals to produce at least one phase-shifted split signal and at least one split signal;

filtering, using a first lattice filter, the at least one phase-shifted split signal to produce a first filtered signal;

filtering, using a second lattice filter, the at least one split signal to produce a second filtered signal;

shifting at least one of a phase of the first filtered signal or a phase of the second filtered signal to produce at least one phase-shifted filtered signal and at least one filtered signal; and combining the at least one phase-shifted filtered signal and the at least one filtered signal to produce an output signal.

Example aspect 35: The method of example aspect 34, wherein:

the at least one phase-shifted split signal comprises a first phase-shifted split signal;

the at least one split signal comprises a second phase-shifted split signal;

the at least one phase-shifted filtered signal comprises a first phase-shifted filtered signal;

the at least one filtered signal comprises a second phase-shifted filtered signal.

Example aspect 36: The method of example aspect 34 or example aspect 35, wherein the splitting of the input signal and the shifting of the phase of the one or more split signals are performed by a hybrid coupler.

Example aspect 37: The method of any one of example aspects 34-36, wherein the filtering of the at least one phase-shifted split signal comprises:

propagating at least a portion of the at least one phase-shifted split signal through a first acoustic resonator having a first crystal orientation; and propagating the at least a portion of the at least one phase-shifted split signal through a second acoustic resonator having a second crystal orientation that is virtually inverted relative to the first crystal orientation.

Example aspect 38: An apparatus comprising:

a filter circuit comprising:

a first hybrid coupler comprising a first port, a second port, a third port, and a fourth port, the third port coupled to a first filter port of the filter circuit, the fourth port coupled to a first load;

a second hybrid coupler comprising a first port, a second port, a third port, and a fourth port, the third port of the second hybrid coupler coupled to a second load, the fourth port of the second hybrid coupler coupled to a second filter port of the filter circuit;

a first lattice filter coupled between the first port of the first hybrid coupler and the first port of the second hybrid coupler; and a second lattice filter coupled between the second port of the first hybrid coupler and the second port of the second hybrid coupler.

Example aspect 39: The apparatus of example aspect 38, wherein:

the first hybrid coupler comprises a first ninety-degree (90°) hybrid coupler;

the second hybrid coupler comprises a second ninety-degree (90°) hybrid coupler; and the first hybrid coupler and the second hybrid coupler are jointly configured to at least substantially reduce a third-order harmonic of a signal propagating through the filter circuit.

Example aspect 40: The apparatus of example aspect 38 or example aspect 39, wherein:

the first lattice filter comprises a first half lattice filter comprising:
  a phase shifter;
  a first acoustic resonator, a third acoustic resonator, and the phase shifter coupled together in series between the first port of the first hybrid coupler and the first port of the second hybrid coupler; and
  a second acoustic resonator and a fourth acoustic resonator coupled together in series between the first port of the first hybrid coupler and the first port of the second hybrid coupler; and the second lattice filter comprises a second half lattice filter comprising:
  a phase shifter;
  a first acoustic resonator, a third acoustic resonator, and the phase shifter coupled together in series between the second port of the first hybrid coupler and the second port of the second hybrid coupler; and
  a second acoustic resonator and a fourth acoustic resonator coupled together in series between the second port of the first hybrid coupler and the second port of the second hybrid coupler.

Example aspect 41: The apparatus of example aspect 40, wherein:

the first acoustic resonator and the third acoustic resonator of the first half lattice filter are coupled together in anti-series; and the second acoustic resonator and the fourth acoustic resonator of the first half lattice filter are coupled together in anti-series.

Example aspect 42: The apparatus of example aspect 38 or example aspect 39, wherein:

the first lattice filter comprises a first half lattice filter comprising:
  a phase shifter;
  a first acoustic resonator, the first acoustic resonator and the phase shifter coupled together in series between the first port of the first hybrid coupler and the first port of the second hybrid coupler; and
  a second acoustic resonator coupled between the first port of the first hybrid coupler and the first port of the second hybrid coupler; and the second lattice filter comprises a second half lattice filter comprising:
  a phase shifter;
  a first acoustic resonator, the first acoustic resonator and the phase shifter coupled together in series between the second port of the first hybrid coupler and the second port of the second hybrid coupler; and
  a second acoustic resonator coupled between the second port of the first hybrid coupler and the second port of the second hybrid coupler.

Example aspect 43: An apparatus comprising:
a filter circuit comprising:
  a first filter port;
  a second filter port;
  a first half lattice filter coupled between the first filter port and the second filter port, the first half lattice filter comprising:
    a phase shifter;
    a first acoustic resonator, a third acoustic resonator, and the phase shifter coupled together in series between a first port of the first half lattice filter and a second port of the first half lattice filter; and
    a second acoustic resonator and a fourth acoustic resonator coupled together in series between the first port of the first half lattice filter and the second port of the first half lattice filter; and
  a second half lattice filter coupled between the first filter port and the second filter port, the second half lattice filter comprising:
    a phase shifter;
    a first acoustic resonator, a third acoustic resonator, and the phase shifter of the second half lattice filter coupled together in series between a first port of the second half lattice filter and a second port of the second half lattice filter; and
    a second acoustic resonator and a fourth acoustic resonator coupled together in series between the first port of the second half lattice filter and the second port of the second half lattice filter.

Example aspect 44: The apparatus of example aspect 43, wherein the filter circuit comprises:

a first signal manipulator circuit coupled between the first filter port and the first half lattice filter and between the first filter port and the second half lattice filter; and a second signal manipulator circuit coupled between the second filter port and the first half lattice filter and between the second filter port and the second half lattice filter.

Example aspect 45: The apparatus of example aspect 43, wherein for the first half lattice filter:

a crystal orientation of the first acoustic resonator is virtually opposite a crystal orientation of the third acoustic resonator; and a crystal orientation of the second acoustic resonator is virtually opposite a crystal orientation of the fourth acoustic resonator.

As used herein, the terms "couple," "coupled," or "coupling" refer to a relationship between two or more components that are in operative communication with each other to implement some feature or realize some capability that is described herein. The coupling can be realized using, for instance, a physical line, such as a metal trace or wire, or an electromagnetic coupling, such as with a transformer. A coupling can include a direct coupling or an indirect coupling. A direct coupling refers to connecting discrete circuit elements via a same node without an intervening element.

An indirect coupling refers to connecting discrete circuit elements via one or more other devices or other discrete circuit elements, including two or more different nodes.

The term "port" (e.g., including a "first port" or a "filter port") represents at least a point of electrical connection at or proximate to the input or output of a component or between two or more components (e.g., active or passive circuit elements or parts). Although at times a port may be visually depicted in a drawing as a single point (or a circle), the port can represent an inter-connected portion of a physical circuit or network that has at least approximately a same voltage potential at or along the portion. In other words, a port can represent at least one point (e.g., a node) of multiple points along a conducting medium (e.g., a wire or trace) that exists between electrically connected components. In some cases, a "port" can represent at least one node that represents or corresponds to an input or an output of a component, such as a filter or part thereof.

The terms "first," "second," "third," and other numeric-related indicators are used herein to identify or distinguish similar or analogous items from one another within a given context—such as a particular implementation, a single drawing figure, a given component, or a claim. Thus, a first item in one context may differ from a first item in another context. For example, an item identified as a "first filter" in one context may be identified as a "second filter" in another context. Similarly, a "first resonator" or a "first electrode" in one claim may be recited as a "second resonator" or a "second electrode, respectively," in a different claim.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). As used herein, a phrase referring to "at least one of" a list of items refers to any combination of those items, including single members. As an example, "at least one of a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
   a filter circuit comprising:
   a first filter port;
   a second filter port;
   a first signal manipulator circuit comprising a first port, a second port, and a third port coupled to the first filter port, the first signal manipulator circuit configured to:
   split an input signal into multiple split signals;
   shift a phase of one or more split signals of the multiple split signals to produce at least one phase-shifted split signal and at least one split signal; and
   provide the at least one phase-shifted split signal and the at least one split signal to the first port and the second port;
   a first lattice filter coupled to the first port of the first signal manipulator circuit;
   a second lattice filter coupled to the second port of the first signal manipulator circuit; and
   a second signal manipulator circuit comprising a first port coupled to the first lattice filter, a second port coupled to the second lattice filter, and a third port coupled to the second filter port, the second signal manipulator circuit configured to:
   accept multiple filtered signals from the first lattice filter and the second lattice filter;
   shift a phase of one or more filtered signals of the multiple filtered signals to produce at least one phase-shifted filtered signal and at least one filtered signal; and
   combine the at least one phase-shifted filtered signal and the at least one filtered signal into an output signal at the third port of the second signal manipulator circuit, wherein the first signal manipulator circuit and the second signal manipulator circuit are jointly configured to:
   at least attenuate at the output signal a third-order harmonic or a second-order harmonic that is generated based on the input signal by at least one of the first lattice filter or the second lattice filter.

2. The apparatus of claim 1, wherein:
the first signal manipulator circuit comprises a hybrid coupler comprising a first hybrid port, a second hybrid port, and a third hybrid port;
the first hybrid port of the hybrid coupler is coupled to the first port of the first signal manipulator circuit;
the second hybrid port of the hybrid coupler is coupled to the second port of the first signal manipulator circuit; and
the third hybrid port of the hybrid coupler is coupled to the third port of the first signal manipulator circuit.

3. The apparatus of claim 2, wherein:
the hybrid coupler comprises a fourth hybrid port; and
the filter circuit comprises at least one load component coupled between the fourth hybrid port and a ground.

4. The apparatus of claim 2, wherein:
the hybrid coupler comprises a ninety-degree (90°) hybrid coupler.

5. The apparatus of claim 2, wherein:
the hybrid coupler is configured to output the at least one phase-shifted split signal and the at least one split signal, the at least one phase-shifted split signal and the at least one split signal having respective phases that are approximately ninety degrees (90°) apart from each other.

6. The apparatus of claim 2, wherein:
the hybrid coupler of the first signal manipulator circuit comprises a first hybrid coupler;
the second signal manipulator circuit comprises a second hybrid coupler comprising a first hybrid port, a second hybrid port, and a third hybrid port;
the first hybrid port of the second hybrid coupler is coupled to the first port of the second signal manipulator circuit;

the second hybrid port of the second hybrid coupler is coupled to the second port of the second signal manipulator circuit; and the third hybrid port of the second hybrid coupler is coupled to the third port of the second signal manipulator circuit.

7. The apparatus of claim 6, wherein:
the first hybrid coupler comprises a first ninety-degree (90°) hybrid coupler; and
the second hybrid coupler comprises a second ninety-degree(90°) hybrid coupler.

8. The apparatus of claim 1, wherein the first signal manipulator circuit comprises:
a power divider comprising an input node, a first output node, and a second output node, the input node coupled to the third port of the first signal manipulator circuit;
a first phase shifter coupled between the first output node and the first port of the first signal manipulator circuit; and
a second phase shifter coupled between the second output node and the second port of the first signal manipulator circuit.

9. The apparatus of claim 8, wherein:
the first phase shifter is configured to shift a phase of a first split signal of the multiple split signals by approximately positive forty-five degrees)(+45°; and
the second phase shifter is configured to shift a phase of a second split signal of the multiple split signals by approximately negative forty-five degrees)(−45°.

10. The apparatus of claim 8, wherein:
the first phase shifter is configured to shift a phase of a first split signal of the multiple split signals by approximately positive ninety degrees)(+90°; and
the second phase shifter is configured to shift a phase of a second split signal of the multiple split signals by approximately negative ninety degrees)(−90°.

11. The apparatus of claim 8, wherein the second signal manipulator circuit comprises:
a power combiner comprising a first input node, a second input node, and an output node, the output node coupled to the third port of the second signal manipulator circuit;
a first phase shifter coupled between the first port of the second signal manipulator circuit and the first input node; and
a second phase shifter coupled between the second port of the second signal manipulator circuit and the second input node.

12. The apparatus of claim 1, wherein the filter circuit further comprises:
a first inductor coupled between a ground and the first port of the first signal manipulator circuit at a node located between the first signal manipulator circuit and the first lattice filter; and
a second inductor coupled between the ground and the first port of the second signal manipulator circuit at another node located between the second signal manipulator circuit and the first lattice filter.

13. The apparatus of claim 1, wherein the first lattice filter comprises:
a first signal path coupled between the first port of the first signal manipulator circuit and the first port of the second signal manipulator circuit, the first signal path comprising a first resonator circuit; and
a second signal path coupled between the first port of the first signal manipulator circuit and the first port of the second signal manipulator circuit, the second signal path comprising a second resonator circuit.

14. The apparatus of claim 13, wherein:
the first signal path comprises a phase shifter; and
the first resonator circuit and the phase shifter are coupled together in series between the first port of the first signal manipulator circuit and the first port of the second signal manipulator circuit.

15. The apparatus of claim 13, wherein:
the first resonator circuit comprises at least one acoustic resonator; and
the second resonator circuit comprises at least one acoustic resonator.

16. The apparatus of claim 15, wherein the at least one acoustic resonator of the first resonator circuit comprises:
a first acoustic resonator; and
a second acoustic resonator coupled to the first acoustic resonator.

17. The apparatus of claim 16, wherein:
the first acoustic resonator and the second acoustic resonator are coupled together in anti-series between the first port of the first signal manipulator circuit and the first port of the second signal manipulator circuit.

18. The apparatus of claim 16, wherein:
the first acoustic resonator and the second acoustic resonator are coupled together in anti-parallel between the first port of the first signal manipulator circuit and the first port of the second signal manipulator circuit.

19. The apparatus of claim 16, wherein:
the first acoustic resonator comprises at least one piezoelectric material having a crystal axis;
the second acoustic resonator comprises the at least one piezoelectric material having a crystal axis; and
the first and second acoustic resonators are electrically connected such that respective electric fields within the at least one piezoelectric material of the first and second acoustic resonators are opposite in phase with regard to the respective crystal axis of each acoustic resonator of the first and second acoustic resonators.

20. The apparatus of claim 16, wherein:
the first acoustic resonator comprises a first bulk acoustic wave (BAW) resonator of the first resonator circuit of the first signal path; and
the second acoustic resonator comprises a second BAW resonator of the first resonator circuit of the first signal path.

21. The apparatus of claim 16, wherein:
a resonance frequency of the first acoustic resonator is substantially equal to a resonance frequency of the second acoustic resonator; and
a static capacitance of the first acoustic resonator is substantially equal to a static capacitance of the second acoustic resonator.

22. The apparatus of claim 16, wherein the first acoustic resonator and the second acoustic resonator are jointly configured to:
at least further attenuate the second-order harmonic that is generated by the first acoustic resonator individually and the second acoustic resonator individually.

23. The apparatus of claim 16, wherein:
the first acoustic resonator comprises:
a first electrode;
a second electrode; and
a piezoelectric material coupled to the first electrode and the second electrode, the piezoelectric material having a crystal axis that is directed from the first electrode to the second electrode;

the second acoustic resonator comprises:
a first electrode;
a second electrode; and
a piezoelectric material coupled to the first electrode and the second electrode of the second acoustic resonator, the piezoelectric material having a crystal axis that is directed from the first electrode to the second electrode of the second acoustic resonator;
the first acoustic resonator is coupled in series with the second acoustic resonator; and
the second electrode of the first acoustic resonator is coupled to the second electrode of the second acoustic resonator.

24. The apparatus of claim 16, wherein:
the first acoustic resonator comprises a piezoelectric material having a crystal axis;
the second acoustic resonator comprises a piezoelectric material having a crystal axis; and
the first lattice filter is configured to:
propagate at least a portion of at least one current in a direction of the crystal axis of the first acoustic resonator at a given time; and
propagate at least a portion of the at least one current against a direction of the crystal axis of the second acoustic resonator at the given time.

25. The apparatus of claim 16, wherein:
the first acoustic resonator comprises a piezoelectric material having a crystal axis;
the second acoustic resonator comprises a piezoelectric material having a crystal axis; and
the first lattice filter is configured to:
apply at least one voltage across the first acoustic resonator and the second acoustic resonator in a direction of the crystal axis of the first acoustic resonator at a given time and against a direction of the crystal axis of the second acoustic resonator at the given time.

26. The apparatus of claim 1, wherein:
the first lattice filter comprises a first full lattice filter; and
the second lattice filter comprises a second full lattice filter.

27. The apparatus of claim 1, further comprising:
a radio-frequency front-end comprising the filter circuit.

28. The apparatus of claim 27, further comprising:
a wireless interface device comprising the radio-frequency front-end;
a display screen; and
at least one processor operatively coupled to the display screen and at least a portion of the wireless interface device, the at least one processor configured to present one or more graphical images on the display screen based on one or more wireless signals communicated using the filter circuit of the wireless interface device.

29. A method for filtering a signal, the method comprising:
splitting an input signal into multiple split signals;
shifting a phase of one or more split signals of the multiple split signals to produce at least one phase-shifted split signal and at least one split signal, wherein the splitting of the input signal and the shifting of the phase of the one or more split signals are performed by a hybrid coupler;
filtering, using a first lattice filter, the at least one phase-shifted split signal to produce a first filtered signal;
filtering, using a second lattice filter, the at least one split signal to produce a second filtered signal;
shifting at least one of a phase of the first filtered signal or a phase of the second filtered signal to produce at least one phase-shifted filtered signal and at least one filtered signal; and
combining the at least one phase-shifted filtered signal and the at least one filtered signal to produce an output signal.

30. The method of claim 29, wherein:
the at least one phase-shifted split signal comprises a first phase-shifted split signal;
the at least one split signal comprises a second phase-shifted split signal;
the at least one phase-shifted filtered signal comprises a first phase-shifted filtered signal;
the at least one filtered signal comprises a second phase-shifted filtered signal.

31. The method of claim 29, wherein the filtering of the at least one phase-shifted split signal comprises:
propagating at least a portion of the at least one phase-shifted split signal through a first acoustic resonator having a first crystal orientation; and
propagating the at least a portion of the at least one phase-shifted split signal through a second acoustic resonator having a second crystal orientation that is virtually inverted relative to the first crystal orientation.

32. An apparatus comprising:
a filter circuit comprising:
a first hybrid coupler comprising a first port, a second port, a third port, and a fourth port, the third port coupled to a first filter port of the filter circuit, the fourth port coupled to a first load;
a second hybrid coupler comprising a first port, a second port, a third port, and a fourth port, the third port of the second hybrid coupler coupled to a second load, the fourth port of the second hybrid coupler coupled to a second filter port of the filter circuit;
a first lattice filter coupled between the first port of the first hybrid coupler and the first port of the second hybrid coupler; and
a second lattice filter coupled between the second port of the first hybrid coupler and the second port of the second hybrid coupler, wherein
the first lattice filter comprises a first half lattice filter comprising:
a phase shifter;
a first acoustic resonator, the first acoustic resonator and the phase shifter coupled together in series between the first port of the first hybrid coupler and the first port of the second hybrid coupler; and
a second acoustic resonator coupled between the first port of the first hybrid coupler and the first port of the second hybrid coupler; and
the second lattice filter comprises a second half lattice filter comprising:
a phase shifter;
a first acoustic resonator, the first acoustic resonator and the phase shifter coupled together in series between the second port of the first hybrid coupler and the second port of the second hybrid coupler; and
a second acoustic resonator coupled between the second port of the first hybrid coupler and the second port of the second hybrid coupler.

33. The apparatus of claim 32, wherein:
the first hybrid coupler comprises a first ninety-degree (90°) hybrid coupler;

the second hybrid coupler comprises a second ninety-degree(90°) hybrid coupler; and the first hybrid coupler and the second hybrid coupler are jointly configured to at least substantially reduce a third-order harmonic of a signal propagating through the filter circuit.

34. The apparatus of claim 32, wherein:

the first half lattice filter further comprises:
- a third acoustic resonator coupled between the first port of the first hybrid coupler and the first port of the second hybrid coupler in a path including the first acoustic resonator and the phase shifter of the first half lattice filter; and
- a fourth acoustic resonator coupled in series between the first port of the first hybrid coupler and the first port of the second hybrid coupler in a path including the second acoustic resonator of the first half lattice filter; and the second half lattice filter further comprises:
- a third acoustic resonator coupled between the second port of the first hybrid coupler and the second port of the second hybrid coupler in a path including the first acoustic resonator and the phase shifter of the second half lattice filter; and
- a fourth acoustic resonator coupled between the second port of the first hybrid coupler and the second port of the second hybrid coupler in a path including the second acoustic resonator of the second half lattice filter.

35. The apparatus of claim 34, wherein:

the first acoustic resonator and the third acoustic resonator of the first half lattice filter are coupled together in anti-series; and the second acoustic resonator and the fourth acoustic resonator of the first half lattice filter are coupled together in anti-series.

36. An apparatus comprising:

a filter circuit comprising:
- a first filter port;
- a second filter port;
- a first signal manipulator circuit comprising a first port, a second port, and a third port coupled to the first filter port, the first signal manipulator circuit configured to:
  - split an input signal into multiple split signals;
  - shift a phase of one or more split signals of the multiple split signals to produce at least one phase-shifted split signal and at least one split signal; and
  - provide the at least one phase-shifted split signal and the at least one split signal to the first port and the second port;
- a first lattice filter coupled to the first port of the first signal manipulator circuit;
- a second lattice filter coupled to the second port of the first signal manipulator circuit; and
- a second signal manipulator circuit comprising a first port coupled to the first lattice filter, a second port coupled to the second lattice filter, and a third port coupled to the second filter port, the second signal manipulator circuit configured to:
  - accept multiple filtered signals from the first lattice filter and the second lattice filter;
  - shift a phase of one or more filtered signals of the multiple filtered signals to produce at least one phase-shifted filtered signal and at least one filtered signal; and
  - combine the at least one phase-shifted filtered signal and the at least one filtered signal into an output signal at the third port of the second signal manipulator circuit, wherein the first lattice filter comprises:
    - a first signal path coupled between the first port of the first signal manipulator circuit and the first port of the second signal manipulator circuit, the first signal path comprising a first resonator circuit and a phase shifter, the first resonator circuit comprising at least one acoustic resonator comprising a first acoustic resonator and a second acoustic resonator coupled to the first acoustic resonator, wherein the first resonator circuit and the phase shifter are coupled together in series between the first port of the first signal manipulator circuit and the first port of the second signal manipulator circuit; and
    - a second signal path coupled between the first port of the first signal manipulator circuit and the first port of the second signal manipulator circuit, the second signal path comprising a second resonator circuit comprising at least one acoustic resonator.

37. The apparatus of claim 36, wherein:

the first acoustic resonator and the second acoustic resonator are coupled together in anti-series between the first port of the first signal manipulator circuit and the first port of the second signal manipulator circuit.

38. The apparatus of claim 36, wherein:

the first acoustic resonator and the second acoustic resonator are coupled together in anti-parallel between the first port of the first signal manipulator circuit and the first port of the second signal manipulator circuit.

39. The apparatus of claim 36, wherein:

the first acoustic resonator comprises at least one piezoelectric material having a crystal axis;

the second acoustic resonator comprises the at least one piezoelectric material having a crystal axis; and the first and second acoustic resonators are electrically connected such that respective electric fields within the at least one piezoelectric material of the first and second acoustic resonators are opposite in phase with regard to the respective crystal axis of each acoustic resonator of the first and second acoustic resonators.

40. The apparatus of claim 36, wherein:

a resonance frequency of the first acoustic resonator is substantially equal to a resonance frequency of the second acoustic resonator; and a static capacitance of the first acoustic resonator is substantially equal to a static capacitance of the second acoustic resonator.

41. The apparatus of claim 36, wherein the first acoustic resonator and the second acoustic resonator are jointly configured to:

at least attenuate a second-order harmonic that is generated by the first acoustic resonator individually and the second acoustic resonator individually.

42. The apparatus of claim 36, wherein:

the first acoustic resonator comprises:
- a first electrode;
- a second electrode; and
- a piezoelectric material coupled to the first electrode and the second electrode, the piezoelectric material having a crystal axis that is directed from the first electrode to the second electrode;

the second acoustic resonator comprises:
- a first electrode;
- a second electrode; and a piezoelectric material coupled to the first electrode and the second electrode of the second acoustic resonator, the piezoelectric material having a crystal axis that is directed from the first electrode to the second electrode of the second acoustic resonator;

the first acoustic resonator is coupled in series with the second acoustic resonator; and the second electrode of the first acoustic resonator is coupled to the second electrode of the second acoustic resonator.

\* \* \* \* \*